US010044349B2

(12) United States Patent
Scott et al.

(10) Patent No.: US 10,044,349 B2
(45) Date of Patent: Aug. 7, 2018

(54) RADIO FREQUENCY (RF) SWITCH WITH ON AND OFF SWITCHING ACCELERATION

(71) Applicant: Qorvo US, Inc., Greensboro, NC (US)

(72) Inventors: Baker Scott, San Jose, CA (US); George Maxim, Saratoga, CA (US); Hideya Oshima, Santa Clara, CA (US); Dirk Robert Walter Leipold, San Jose, CA (US); Eric K. Bolton, Kernersville, NC (US); Daniel Charles Kerr, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/585,345

(22) Filed: May 3, 2017

(65) Prior Publication Data
US 2017/0272066 A1     Sep. 21, 2017

Related U.S. Application Data

(63) Continuation-in-part of application No. 15/401,936, filed on Jan. 9, 2017.

(60) Provisional application No. 62/363,536, filed on Jul. 18, 2016, provisional application No. 62/362,818, filed on Jul. 15, 2016, provisional application No. 62/330,976, filed on May 3, 2016, provisional application No. 62/276,421, filed on Jan. 8, 2016.

(51) Int. Cl.
*H03K 17/04* (2006.01)
*H03K 17/041* (2006.01)
*H03K 17/16* (2006.01)

(52) U.S. Cl.
CPC ..... *H03K 17/04106* (2013.01); *H03K 17/161* (2013.01)

(58) Field of Classification Search
CPC ................ H03K 17/04106; H03K 17/161
USPC ....................................................... 327/376
See application file for complete search history.

(56) References Cited

U.S. PATENT DOCUMENTS

| 9,048,836 B2 | 6/2015 | Maxim et al. |
| 2014/0253217 A1* | 9/2014 | Briere ............ H03K 17/162 327/382 |

(Continued)

OTHER PUBLICATIONS

Lu, Jian et al., "Modeling, Design, and Characterization of Multiturn Bondwire Inductors With Ferrite Epoxy Glob Cores for Power Supply System-on-Chip or System-in-Package Applications," IEEE Transactions on Power Electronics, vol. 25, Issue 8, Aug. 2010, pp. 2010-2017.

*Primary Examiner* — Ryan Jager
(74) *Attorney, Agent, or Firm* — Withrow & Terranova, P.L.L.C.

(57) ABSTRACT

A Radio Frequency (RF) switch having two or more stages coupled in series is disclosed. A first Field-Effect Transistor (FET) with a first control terminal is coupled across a gate resistor to shunt the gate resistor when the first FET is on. An RF switching device is configured to pass an RF signal between a signal input and a signal output when the RF switching device is on. A second FET having a second control terminal coupled to an acceleration output is configured to shunt the RF switching device when the second FET is on. A third FET is coupled between the first control terminal and the signal input for controlling charge on a gate of the first FET. A third control terminal of the third FET is coupled to an acceleration input for controlling an on/off state of the third FET.

20 Claims, 30 Drawing Sheets

(56) References Cited

U.S. PATENT DOCUMENTS

2015/0381171 A1* 12/2015 Cebi .................... H03K 17/687
                                                327/427
2017/0201244 A1   7/2017 Kerr
2017/0201245 A1*  7/2017 Scott ...................... H03K 17/04
2017/0201248 A1   7/2017 Scott et al.

* cited by examiner

RADIO FREQUENCY (RF) SWITCH WITH ON AND OFF SWITCHING ACCELERATION

RELATED APPLICATIONS

This application claims the benefit of U.S. Provisional Application No. 62/330,976, filed May 3, 2016, the disclosure of which is hereby incorporated herein by reference in its entirety.

This application is a continuation-in-part of U.S. patent application Ser. No. 15/401,936, filed Jan. 9, 2017, titled "RF BRANCH WITH ACCELERATED TURN-ON AND HIGH Q VALUE," which claims the benefit of U.S. Provisional Application No. 62/276,421, filed Jan. 8, 2016, U.S. Provisional Application No. 62/362,818, filed Jul. 15, 2016, and U.S. Provisional Application No. 62/363,536, filed Jul. 18, 2016, the disclosures of which are hereby incorporated herein by reference in their entireties.

This application is related to commonly owned and assigned U.S. patent application Ser. No. 15/401,903, filed Jan. 9, 2017, titled "RF BRANCH WITH IMPROVED POWER HANDLING," the disclosure of which is hereby incorporated herein by reference in its entirety.

FIELD OF THE DISCLOSURE

The present disclosure relates to Radio Frequency (RF) switches.

BACKGROUND

Radio Frequency (RF) switches that need to withstand large voltages in the off state use stacked Field-Effect Transistor (FET) configurations. Proper operation requires that each FET has direct current bias on its terminals. A typical RF switch may use a stack of N-type FETs (NFETs) and a bias network to control the state of the transistors, e.g., on or off. Various bias resistor configurations exist. A typical bias network is a parallel or series set of resistors for the gates, bodies, and sources/drains of each transistor.

FIGS. 1A, 1B, and 1C show variations of a conventional approach, in which resistor ladders are used for the gate bias network (RG1, RG2, . . . ), the drain and source bias network (RSD1, RSD2, . . . ), and the bulk bias network (RB1, RB2, . . . ). When the switch is off, the gates are biased at ground level or at a negative potential. To turn the device on, the gate-source voltages of the stacked FETs need to go above the positive threshold voltage (Vth). The bias networks may use resistors configured in series, in parallel, in a tree topology, some other topology, or any combination of the above. For example, FIG. 1A shows a shunt branch with series bias architecture, FIG. 1B shows a branch with parallel bias architecture, and FIG. 1C shows a branch with series bias architecture. Other architectures are contemplated.

Table 1, below, lists some typical bias values (in Volts). In the on state, the source, drain, and body bias voltages are set to 0 Volts and the gate is biased to 2.5 Volts. In the off state, the source and drain are biased to 0 Volts but the body and gate are both set to −2.5 Volts, e.g., strongly off. (The body is sometimes referred to as "the bulk.")

TABLE 1

| State | Vsource | Vdrain | Vbody | Vgate |
|---|---|---|---|---|
| on | 0 | 0 | 0 | 2.5 |
| off | 0 | 0 | −2.5 | −2.5 |

FIG. 1D shows the serial resistance configuration of FIG. 1A, additionally showing the parasitic capacitances at each gate (CG1, CG2, . . . ) and at each source or drain (CSD1, CSD2, . . . ).

Several different parameters should be considered when designing a bias network:

Responsiveness. The speed of turn-on is limited by the Resistor-Capacitor (RC) time constant set by the gate (front) and drain/source (back) resistors and their corresponding capacitances (CG# and CSD#). For example, referring to FIG. 1D, the first FET in the stack, F1, sees mainly its bias resistors RG1 and RSD1 and parasitic capacitances CG1 and CSD1. The later FETs in the stack F2, F3, and F4 see a distributed RC network with complex Elmore delay times. Therefore, the turning on of the FETs in the switch stack is progressive one-after-the-other and can take a long time in case of large bias resistors and/or large capacitances. In general, it is desirable to reduce the loading resulting from the bias resistor networks, which requires a minimization of the number of resistor branches going to external bias lines (ground, positive, or negative). The specifications of the new Fourth Generation (4G) and Fifth Generation (5G) cellular applications, the Wireless Fidelity (WiFi) specification, and many other applications limit the maximum turn-on and turn-off times. Thus, it is desired to keep the resistance of the bias resistors low so that the switch turn-on time is minimized.

Power handling. The resistor network must carry the direct current (DC). In the off state, as the RF voltage differential between the drain and source (VDS) increases, the drain-body and source-body junctions begin to generate current. If the bias network uses very high value resistors, then a DC voltage drop occurs across the bias network, and thus the applied DC voltage is reduced before it reaches the transistor. This causes the power handling to drop. Note that current can flow in the network attached to the body as well as to the source and drain. Thus, it is desired to keep the resistance of the bias resistors low to improve power handling.

Quality Factor. The Quality Factor (Q) of the switch in off state is set by its bias resistor values. A voltage across a resistor causes power dissipation in the resistor. If the RF voltage induces this power dissipation, then the quality factor is reduced. Therefore, very high value resistors must be used in the bias network to ensure a high quality factor. Typical applications with large and very large bias resistor values are high-Q switched capacitor arrays, for example, Programmable Capacitance Arrays (PACs) or Capacitive Digital-to-Analog Converters (C-DACs). Thus, it is desired to keep the resistance of the bias resistors high to maintain a high Q for the switch.

Thus, there is an intrinsic design trade off to be made: bias resistor values should be kept low to improve responsiveness and power handling but should be kept high to improve quality factor in the off state. What is needed, therefore, is a switch design that provides fast response times and acceptable power handling while providing a high quality factor in the off state.

SUMMARY

Achieving a high Quality Factor (Q) switching network requires large-value bias resistors. A high Q results in lower insertion loss. However, the large resistor values in conjunction with the equivalent loading capacitances leads to long switching (on and off) times. Both the front gate bias resistors and the back drain/source bias resistors contribute to the long time constant. In related-art structures the stacked Field-Effect Transistors (FETs) turn on one after the other separated by relatively long delays given by large Resistor-Capacitor (RC) time constants.

The present disclosure relates to a method and apparatus to achieve fast turning on of the stacked FETs using auxiliary shorting switches that use local bias networks. Both P-type FETs (PFETs) and N-type FETs (NFETs) may be used, depending on the polarity of the control signal and the specific points where the local acceleration network is connected. In one embodiment, PFET switches are locally shorting the gate bias resistors. One advantage of these structures is the fact that they do not need additional bias resistor networks going to ground or another bias voltage but can instead be controlled using signals taken from existing nodes in the switch stage circuit. In another embodiment, NFET switches are shorting the drain-source resistors.

In one embodiment, the controls for drain-source resistor shorting switches may be anticipative with respect to the gate of each stacked FET. Such control signals can be generated with a separate branch, split from the main gate bias resistor ladder, the separate branch having smaller time constants. The bulk-drain and bulk-source local switches can also be used as acceleration switches if anticipated gate control signals are available. In general, the bulk switching network and the acceleration switching networks can share one or multiple switch devices.

In addition, a design variation is presented herein that improves power handling of the switch in the off state. In one embodiment, an additional circuit improves performance further during high-VDS conditions by reducing the amount of body current that flows through the bias network resistors. When VDS is high, a rectifier or charge pump circuit takes advantage of that condition to create a locally generated body bias.

According to one aspect, a high Q Radio Frequency (RF) switch comprises one or more stages. Each stage comprises a signal input terminal, a signal output terminal, and a control input terminal. Each stage further comprises a switching device having a first terminal connected to the signal input terminal, a second terminal connected to the signal output terminal, and a third terminal for controlling the on/off state of the switching device. Each stage further comprises a first resistor connected in series between the control input terminal and the third terminal, a first bypass switch for connecting each end of the first resistor to bypass the first resistor when the first bypass switch is closed, and a second resistor connected in series between the signal input terminal and the signal output terminal. The one or more first resistors form a first bias network, the one or more second bias resistors form a second bias network, and the plurality of FETs are connected in series.

In one embodiment, for at least one stage, the first bypass switch operates to bypass the first resistor when the switching device is in the on state and does not operate to bypass the first resistor when the switching device is in the off state.

In one embodiment, for at least one stage, the first bypass switch comprises a plurality of switching devices in series.

In one embodiment, at least one stage further comprises a second bypass switch for connecting each end of the second resistor to bypass the second resistor when the second bypass switch is closed.

In one embodiment, the second bypass switch operates to bypass the second resistor when the switching device is in the on state and does not operate to bypass the second resistor when the switching device is in the off state.

In one embodiment, the control signal for the second bypass switch is derived from the control signal of the first bypass switch.

In one embodiment, the control signal for the second bypass switch is independent from the control signal of the first bypass switch.

In one embodiment, at least one stage further comprises at least one diode connected in series between the second terminal and the control input terminal to provide a discharge path from the second terminal to the control terminal.

In one embodiment, the second terminal is connected to an anode of one of the at least one diode and the control input terminal is connected to a cathode of one of the at least one diode.

In one embodiment, for at least one stage, the switching device comprises a FET, the first terminal comprising a source terminal of the FET, the second terminal comprising a drain terminal of the FET, the third terminal comprising a gate terminal of the FET.

In one embodiment, the FET further comprises a body terminal connected to the body of the FET.

In one embodiment, at least one stage further comprises a first body switch for connecting the source terminal of the FET to the body terminal of the FET when closed and a second body switch for connecting the drain terminal of the FET to the body terminal of the FET when closed.

In one embodiment, the first body switch comprises one or more switching devices in series.

In one embodiment, the second body switch comprises one or more switching devices in series.

In one embodiment, at least one stage further comprises a third body switch for connecting the gate terminal of the FET to the body terminal of the FET when closed.

In one embodiment, the third body switch comprises one or more switching devices in parallel.

In one embodiment, the first body switch or the second body switch also operates as an acceleration network.

In one embodiment, at least one stage further comprises at least one diode connected in series between the source terminal or drain terminal and the body terminal to provide a discharge path from the source terminal or drain terminal to the body terminal.

In one embodiment, the switch comprises multiple stages, wherein the switching devices within the plurality of stages are connected in series.

In one embodiment, the switch provides a pulsed control signal to the third terminal of at least one stage, wherein the pulsed control signal is not active for all of the time that the switching device is on.

In one embodiment, a radio frequency (RF) switch has two or more stages coupled in series. Each stage includes a first FET with a first control terminal is coupled across a gate resistor to shunt the gate resistor when the first FET is on. An RF switching device is configured to pass an RF signal between a signal input and a signal output when the RF switching device is on. A second FET having a second control terminal coupled to an acceleration output is configured to shunt the RF switching device when the second FET is on. A third FET is coupled between the first control terminal and the signal input for controlling charge on a gate of the first FET. A third control terminal of the third FET is coupled to an acceleration input for controlling an on/off state of the third FET.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure

FIG. 2A shows an exemplary turn-on switching acceleration network according to an embodiment of the subject matter described herein, which uses auxiliary switches to short the gate bias network resistors and the source-drain bias network resistors during turn-on.

FIG. 3A shows an exemplary stage for use in an RF switch branch and having a turn-on switching acceleration network according to an embodiment of the subject matter described herein, which uses auxiliary switches to short the gate bias network resistors during turn-on.

FIG. 3B shows an exemplary stage for use in an RF switch branch and having a turn-on switching acceleration network according to another embodiment of the subject matter described herein, which uses auxiliary switches to short the gate bias network resistors and the source-drain bias network resistors during turn-on.

FIG. 3E shows an exemplary stage for use in an RF switch branch and having a turn-on switching acceleration network according to another embodiment of the subject matter described herein, which uses groups of auxiliary switches to short the gate bias network resistors and the source-drain bias network resistors during turn-on.

FIG. 13 is a table comparing values for reference designs and various embodiments according to the subject matter disclosed herein.

DETAILED DESCRIPTION

Figure 1A:
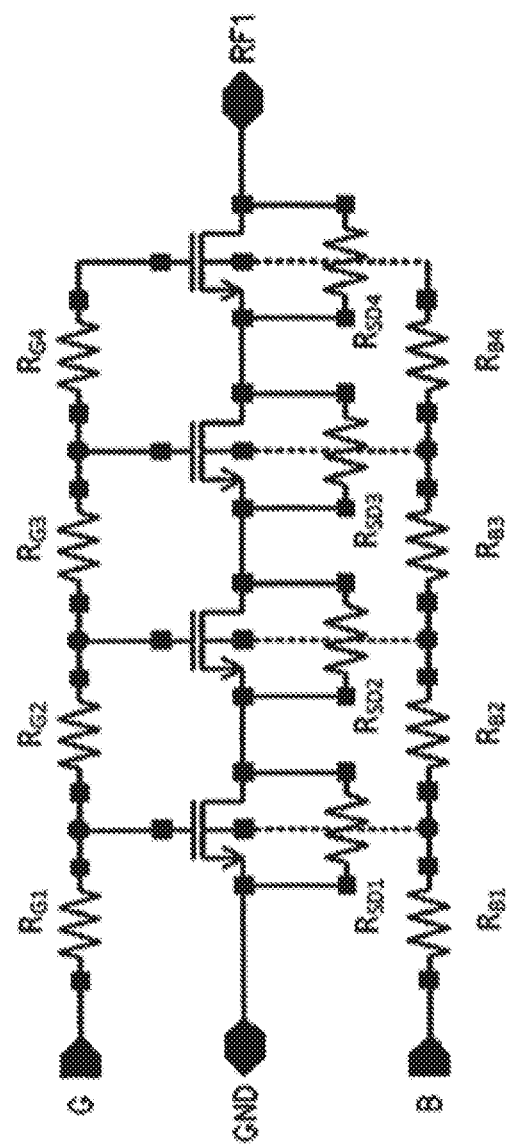
FIG. 1A shows a conventional Radio Frequency (RF) switching branch having a series-connected resistor bias network.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

At the turning on of a conventional stacked Field-Effect Transistor (FET) switch, the individual switches that are further away in the stack from the external gate control signal turn on later and with a relatively long time constant because of the large bias resistor values needed in high Quality Factor (Q) structures. The present disclosure relates to various acceleration shorting techniques. Specifically, the present disclosure relates to a turn-on switching acceleration network that uses auxiliary switches to short the gate and drain/source bias resistor ladders during the turn-on. An additional technique includes a regulator circuit for boosting body bias levels during high power operating conditions.

Figure 2A:
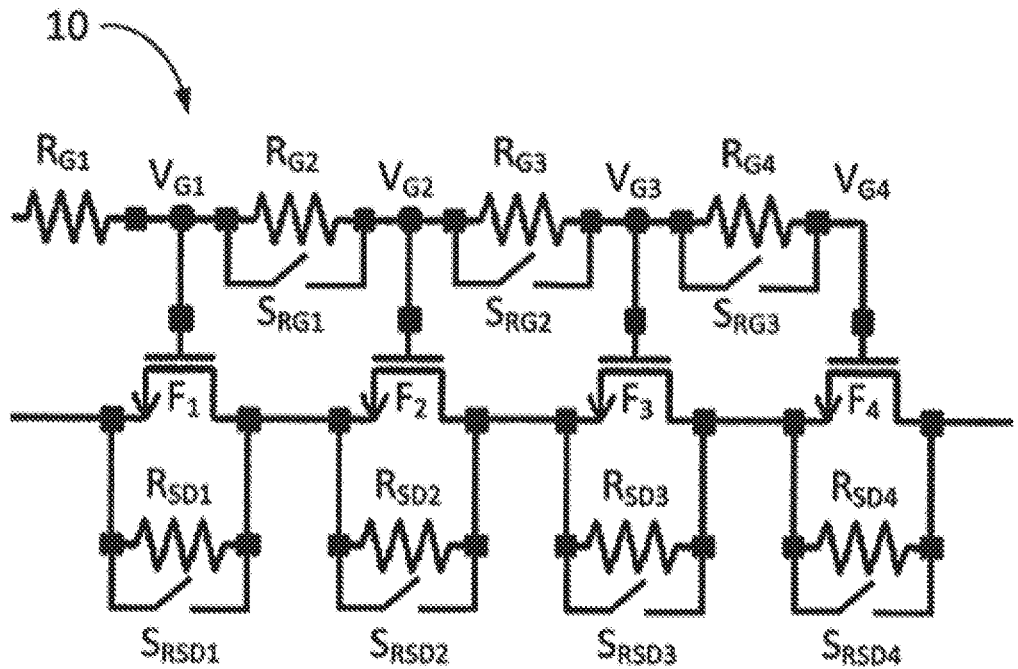

FIG. 2A shows an exemplary turn-on switching acceleration network according to an embodiment of the subject matter described herein, which uses auxiliary switches to short the gate bias network resistors and the source-drain bias network resistors during turn-on. In the embodiment illustrated in FIG. 2A, a Radio Frequency (RF) switch branch 10 includes four FETs, F1 through F4, in series, but switching devices other than FETs may be used, and other numbers of switching devices (e.g., one or more) may be used. A gate bias network includes the bias resistors RG1, RG2, RG3, and RG4, one or more of which may be collectively referred to as "RG#." The voltages present at the respective gates of the set of FETs are represented in FIG. 2A as VG1, VG2, VG3, and VG4, one or more of which may be collectively referred to as "VG#." A source-drain bias network includes the bias resistors RSD1, RSD2, RSD3, and RSD4, one or more of which may be collectively referred to as "RSD#."

To provide turn-on acceleration, the embodiment illustrated in FIG. 2A includes additional switches SRG1, SRG2, and SRG3 that, when closed, bypass the gate bias network resistors RG2, RG3, and RG4, respectively. Additional switches SRSD1, SRSD2, SRSD3, and SRSD4 are included that, when closed, bypass the source-drain bias network resistors RSD1, RSD2, RSD3, and RSD4, respectively. More than one of SRSD, RG, SRSD, and RSD may be referred to as SRSD#, RG#, SRSD#, and RSD#, respectively. In one embodiment, switches SRG# may be P-type FETs, or PFETs, and switches SRSD# may be N-type FETs, or NFETs, but other configurations, including the use of other types of switching devices, is contemplated by the subject matter described herein.

At the end of the turn-on process, the main FETs F1 through F4 are on, shorting the drain/source resistors RSD#, whose role is mainly to provide Direct Current (DC) bias in the off state. To speed up the turn-on process, each element of the gate bias resistor ladder is shorted as soon as the corresponding main switch FET turns on. For example, the voltage VG2 changes with the fast time constant set by the resistance of the switch SRG1 that shorts the resistor RG2 resistor and the switch SRSD1 that shorts the resistor RSD1.

In one embodiment, switches SRG1 and SRSD1 need to be turned on as F1 is turning on. In this way the turning on of F2 is accelerated compared with the turning on in traditional configurations. The fractional time constants at the gate front and at the drain/source back are not necessarily the same, depending on the Resistor-Capacitor (RC) values.

The gate bias resistors (RG#) usually see much larger capacitances compared with what the drain/source resistors (RSD#) see. If the drain/source time constants are much smaller compared with the gate time constants, the SRSD# auxiliary switches may be omitted from the circuit, as shown in FIG. 2B.

Figure 2B:
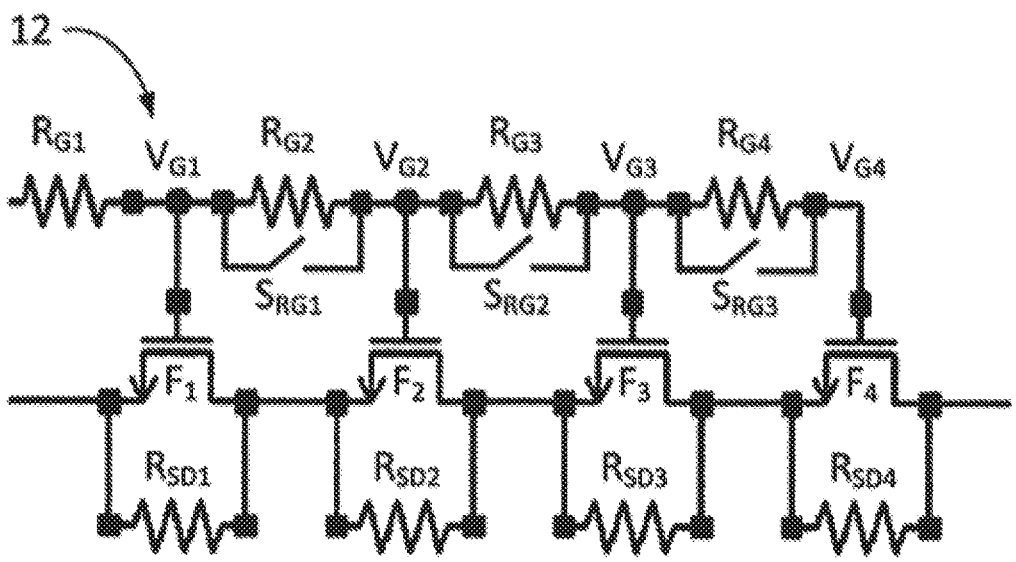
FIG. 2B shows an exemplary turn-on switching acceleration network according to an embodiment of the subject matter described herein, which uses auxiliary switches to short the gate bias network resistors only.

FIG. 2B shows an exemplary turn-on switching acceleration network 12 according to an embodiment of the subject matter described herein, which uses auxiliary switches to short the gate bias network resistors only. This configuration may be used when the RC time constant of the gate bias network is much larger than the RC time constant of the source-drain bias network. In yet another embodiment (not shown), the drain/source resistors (RSD#) may be omitted entirely.

Figure 3A:
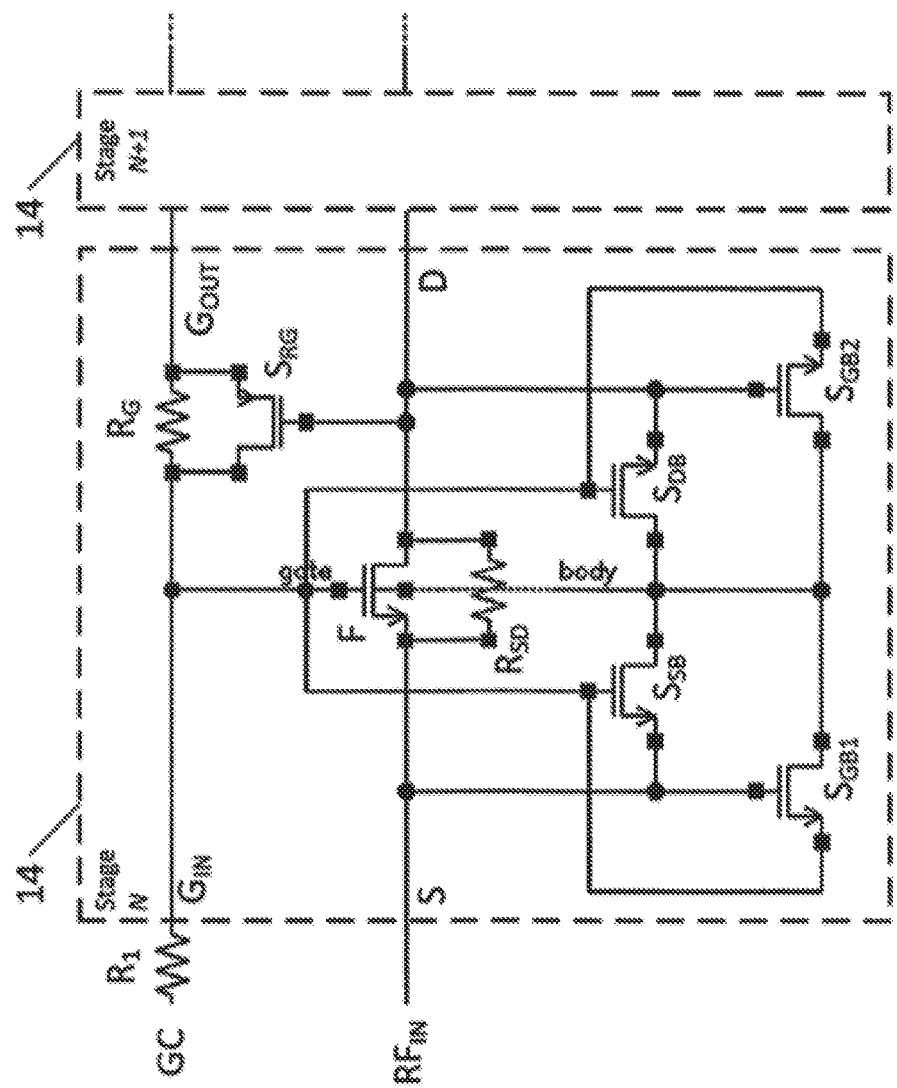

FIG. 3A shows an exemplary stage 14 for use in an RF switch branch and having a turn-on switching acceleration network according to an embodiment of the subject matter described herein, using auxiliary switches to short the gate bias network resistors during turn-on. FIG. 3A illustrates an embodiment of a switching acceleration network used in conjunction with a body switching network. In an exemplary configuration, an RF branch would use one or more instances of the stage 14 connected in series.

Each stage 14 includes a GIN terminal for accepting the gate control signal GC and a GOUT terminal for passing the gate control signal GC to the next stage. For this stage 14 and other stages described below, the last stage in a multi-stage switch need not include the elements downstream from (e.g., to the right of) the gate terminal of F, such as the GOUT terminal, RG, and SRG in the stage 14. Each stage 14 includes a source terminal S and a drain terminal D that connect to the source and drain, respectively, of the main switch device, which in this embodiment comprises a FET F, but other switching devices are also within the scope of the subject matter described herein. The stages may be connected in series to create a multi-stage switch branch by connecting the D terminal of stage N to the S terminal of stage N+1 and by connecting the GOUT terminal of stage N to the GIN terminal of stage N+1. It should be noted that most FETs are symmetric, i.e., the terminals labeled "source" and "drain" could alternatively be labeled "drain" and "source" respectively. In the embodiment illustrated in FIG. 3A, each stage 14 includes a gate bias resistor RG that, along with resistor R1, is part of a gate bias network and a source-drain bias resistor RSD that is part of source-drain bias network. In one embodiment, the source-drain bias resistor RSD may be omitted.

In the embodiment illustrated in FIG. 3A, an additional switch, SRG, is provided that, when on, creates a bypass path around RG, effectively creating a short circuit around RG. By nullifying the resistance RG, the RC constant is reduced dramatically, which reduces the time it takes to charge the gate of the main FET F. This results in an accelerated turn-on of each of the stages as compared to conventional circuits that do not have the bypass switch SRG.

FIG. 3A also illustrates a set of switches that create a body bias network. In the embodiment illustrated in FIG. 3A, each stage 14 contains a switch SSB, that, when on, connects the source terminal S to the body of the device F. A similar switch SDB connects the drain terminal D to the body of the device F. Switches SGB1 and SGB2 are provided that, when on, connect the gate terminal to the body of the device F. The operation of this body bias network will now be described.

When the main switch F is off, the switches SGB1 (left) and SGB2 (right) are shorting symmetrically the bulk (body) to the gate, which in turn is negatively biased to ensure reliable turning off in the presence of large signal swings. The symmetric switching helps improve the even-order harmonic distortion terms. When the main switch F is on, the switches SSB and SDB are shorting the bulk (body) to the source and drain, respectively.

Figure 3B:
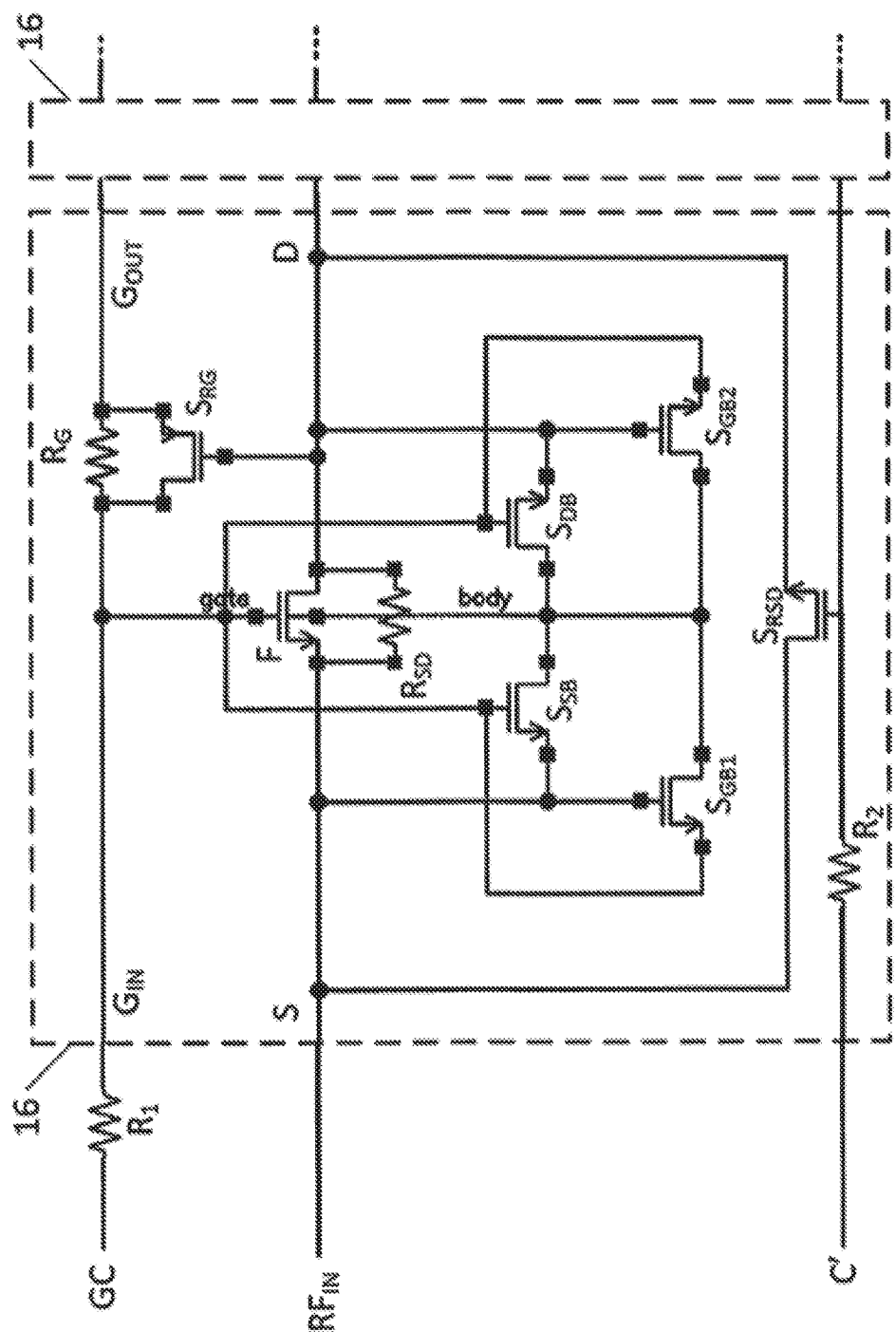

FIG. 3B shows an exemplary stage 16 for use in an RF switch branch and having a turn-on switching acceleration network according to another embodiment of the subject matter described herein, which uses auxiliary switches to short the gate bias network resistors and the source-drain bias network resistors during turn-on. The features RG, SRG, F, RSD, SSB, SDB, SGB1, and SGB2 are identical to the like-named elements in FIG. 3A; therefore, their descriptions will not be repeated here.

In the embodiment illustrated in FIG. 3B, which does include the optional bias resistor RSD, an additional switch, SRSD, is provided that, when on, connects terminal S to terminal D, which effectively bypasses the bias resistor RSD. Thus, in addition to the accelerating the gate control signal GC, the embodiment illustrated in FIG. 3B includes the switch SRSD that reduces the current that might otherwise flow through RSD while the switch is in the on state, which improves the Q factor of the stage and of the multi-stage RF switch as a whole. In the embodiment illustrated in FIG. 3B, SRSD is controlled by a separate control signal, C'. As will be described in more detail below, in different embodiments C' may simply a copy of GC, C' may be derived from GC, or C' may be completely separate from GC.

The drain-source equivalent resistance of FET F becomes very small only after its gate-source voltage is well above the threshold voltage Vth. To speed up the turn-on, the RSD# resistors should be shorted before the main switch device has fully turned on. Referring to FIG. 3B for example, the RSD resistor needs to be shorted before the FET F has fully turned on. As such, the auxiliary shorting switch SRSD needs to have a gate control that is ahead in time compared with the gate control signal of FET F.

There are several ways in which the drain-source shunting acceleration switch control can be implemented. In one embodiment, a copy of the GC signal is provided to the drain-source acceleration switches SRSD through a network containing resistor R2. In one embodiment, for example, GC and C' are simply connected together, and by selecting a value of R2 that is less than the value of R1+RG, the copy of the control signal that is sent to SRSD will arrive more quickly, causing SRSD to turn on before SRG. An example waveform is shown in FIG. 3C.

Figure 3C:
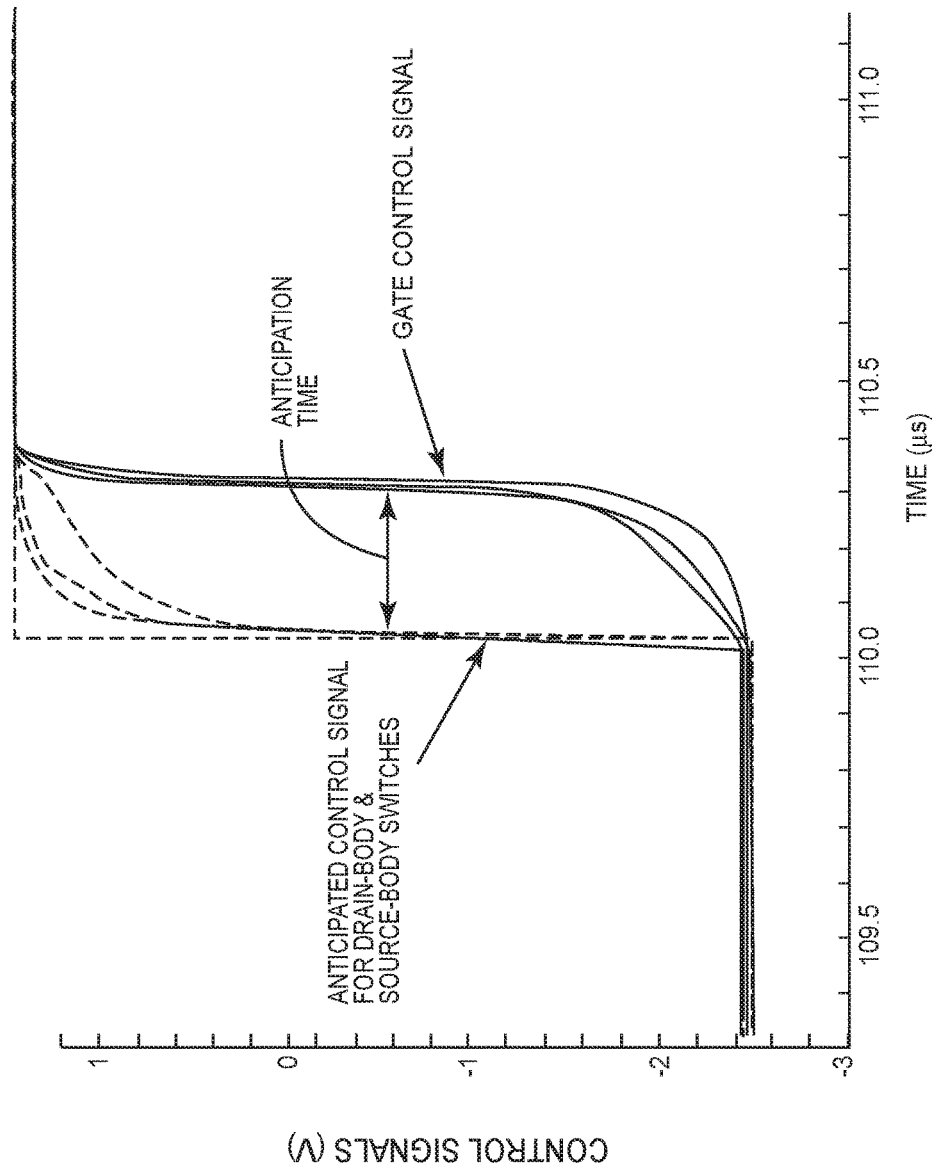
FIG. 3C is a plot of waveforms over time of separate control signals according to an embodiment of the subject matter described herein.

FIG. 3C is a plot of waveforms over time of separate control signals according to an embodiment of the subject matter described herein. In FIG. 3C, one set of control signals, such as signals to control the drain-source acceleration switches SRSD, for example, arrive before a second set of control signals, such as the gate control signal. The first set of control signals is said to "anticipate" (i.e., arrive before) the second set of control signals. The delay between the transition of the first set of control signals and the transition of the second set of control signals may be referred to as the "anticipation time." FIG. 3C shows first and second control signals for each of three stages. For each stage, the first control signal for that stage arrives before the second control signal for that stage. Likewise the first control signal for stage N in a signal chain is slightly ahead of the first control signal for stage N+1 in that signal chain, and so on. This configuration allows the accelerations switches to turn on before the main switching devices turn on. Alternatively, C' may be derived from GC, e.g., C' may be a copy of GC that has been passed through a delay circuit.

In an alternative embodiment, a separate control signal, rather than GC, may be used to control the SRSD switches. In one embodiment, this separate control signal C' may have a pulsed waveform or a waveform that is otherwise shaped to optimize the turn-on timing of SRSD. An example of this is illustrated in FIG. 3D.

Figure 3D:
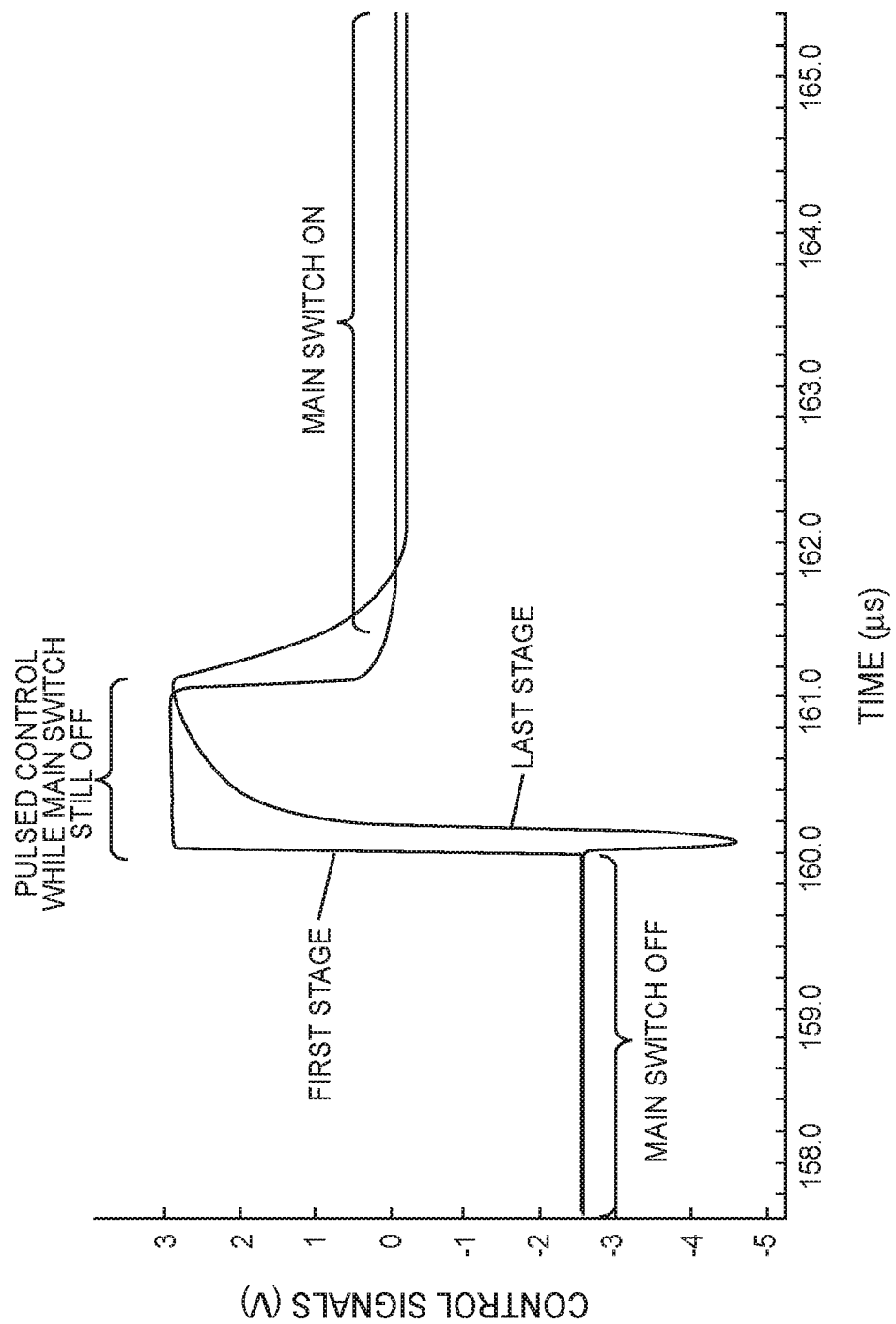
FIG. 3D is a plot of waveforms over time of pulsed control signals that control acceleration switches SRSD (and/or other switches) within each stage according to an embodiment of the subject matter described herein.

FIG. 3D is a plot of waveforms over time of pulsed control signals that control acceleration switches SRSD (and/or other switches) within each stage according to an embodiment of the subject matter described herein. In the example illustrated in FIG. 3D, during turn-on, the acceleration switches SRSD do not need to be on all of the time, but may instead be turned on only at the beginning of the turn-on process, e.g., while the main switches are still off. Once the main switches are on, the acceleration switches need not also be on. FIG. 3D shows the pulsed control signals for the first stage and the last stage of a multi-stage RF switch. The waveforms in FIG. 3D are labeled "first stage" and "last stage," respectively. The pulsed signal of the first stage is closest to the control signal driver and thus has a fast time constant, i.e., the pulse is sharp and relatively square. The pulsed signal that reaches the last stage is farthest from the driver and thus has a slow time constant, i.e., the pulse is more rounded and has a longer rise time and a longer fall time. In the embodiment shown in FIG. 3D, the VGS of the acceleration switch is 2.8 volts when the acceleration switch is on, 0 volts when the acceleration switch is in "soft-off" mode, and −2.8 volts when the accelerations switch is in "hard-off" mode. This provides good distortion tolerance in Power Amplifier Control (PAC) style switches bias circuits where VGBIAS=VRF/(number of stages).

In one embodiment, a pulse-shaping or other circuit may produce a pulsed control signal in accordance with this principle, e.g., by activating SRSD only during the first part of the turn-on process. In one embodiment, the time constant of the SRSD control signal network may be shorter than the time constant of other control signals. In one embodiment, the timing of the pulsed control signal may be adjusted relative to the timing of signals that control SRG or other acceleration switches, e.g., to cause the SRSD control signal to lead (or even lag) other control signals. In one embodiment, the signal or signals controlling the acceleration switches may cause those switches to turn on before the local gate signal goes above a threshold voltage level. The same principles may be applied during turn-off, e.g., to by accelerating the turn-off by more quickly discharging intermediary nodes.

In the case of a pulsed control for the drain-source acceleration switches, the RSD# resistors are needed in order to have a DC bias all the time for the main switch terminals. In some cases, RSD# resistors may be omitted, provided that DC bias is always provided to the switch terminals. While NFETs are shown in FIG. 3B for the drain-source acceleration switches, alternative embodiments using PFET switches can be derived using appropriate control signals. In alternative embodiments, both NFET and PFET switches can be used. In one embodiment, the switches may be transmission gates, which have parallel connected NFET and PFET switches.

Embodiments having source-drain acceleration switches SRSD but no gate acceleration switches SRG are also within the scope of the present disclosure.

In the example embodiments illustrated FIGS. 3A and 3B, each switch (SRG, SSB, SDB, SGB#, and SRSD) is shown as a single FET, but each switch may be implemented using one or multiple FETs. In one embodiment, the auxiliary shorting switches are biased without using supplementary resistor networks. In one embodiment, the gates of the auxiliary shorting switches are biased directly from the main switch network, in which case the choice of type of auxiliary switch is important to facilitate their direct bias from the main switch network. All such choices will be obvious to those skilled in the art, and are considered to be within the scope of the present disclosure.

FIG. 3B illustrates the use of a branched bias resistor ladder that generates the corresponding anticipative gate control signals for the drain-source shorting switches SRSD. Other implementations are possible using NFETs, PFETs, or a combination of the two. They are all derived from the same principle of shorting the gate and drain/source bias resistor ladders. Although simple ladder bias resistor networks are provided as an example, other bias resistor networks using series, shunt, or hybrid series-shunt resistor networks are possible. For each of those bias resistor networks exists one or more corresponding auxiliary shorting switch configurations to speed up their turning on. A person skilled in the field can easily derive such networks by following the principles discussed in the present disclosure, and all such configurations are considered to be within the scope of the present disclosure.

Similar anticipative networks may be imagined using series, shunt, or hybrid series-shunt resistor networks. These techniques can be used for both regular switches and switches connected to capacitors at one end or at both ends. They also apply to grounded switches—one side connected to ground, single-ended—or floating switches that have radio frequency signal on both terminals. A differential switch is just a particular case of a floating switch. These variations will be obvious to those skilled in the art and are considered to be within the scope of the present disclosure.

In one embodiment, the auxiliary drain-source resistance shorting switch SRSD may be a separate switch, or it may be made to work in conjunction with the bulk local shorting switches. The bulk-drain (SDB) and bulk-source (SSB) switches as shown in FIG. 3B are not used to short the drain-source resistance because they are controlled with the same gate signal as the main switch stacked FETs and thus do not provide any acceleration. However, since SDB and SSB are positioned in parallel with RSD, these switches could be used in place of SRSD if appropriately-timed control signals were used, e.g., anticipated gate control signals that turn SSB and SDB on before the FET F. Such anticipated control signals may be generated in various fashions, including anticipative parallel branches. Other methods of generation will be obvious to those skilled in the art and are considered to be within the scope of the present disclosure.

Figure 3E:
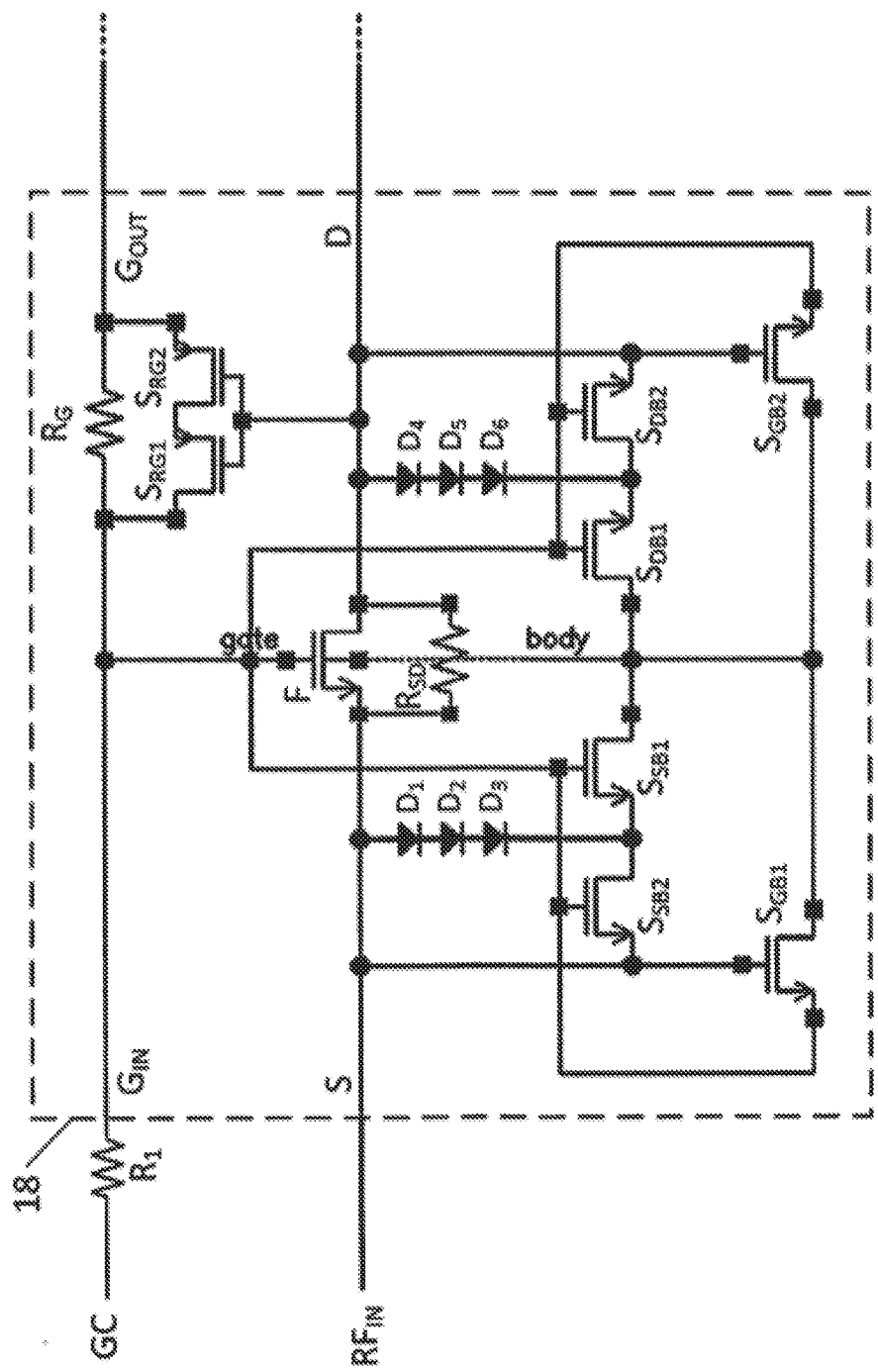

FIG. 3E shows an exemplary stage 18 for use in an RF switch branch and having a turn-on switching acceleration network according to another embodiment of the subject matter described herein, which uses groups of auxiliary switches to short the gate bias network resistors and the source-drain bias network resistors during turn-on. In the embodiment illustrated in FIG. 3E, the stage 18 uses a pair of bypass switches SRG1 and SRG2 to bypass gate bias network resistor RG, rather than the single switch SRG used in the stage 16 of FIG. 3B. Likewise, the stage 18 of FIG. 3E uses a pair of switches SSB1 and SSB2 to short the source to the body and a pair of switches SDB1 and SDB2 to short the drain to the body, rather than a single switch for each. Although the embodiment illustrated in FIG. 3E shows pairs of switches rather than a single switch for each of the above mentioned functions, the subject matter described herein is not limited to just two switches, but contemplates using any number of switches in series, in parallel, or some combination of series and parallel to perform these functions. In the embodiment illustrated in FIG. 3E, a first diode stack D1, D2, and D3, and a second diode stack D4, D5, and D6 provide additional discharge paths.

Figure 4A:
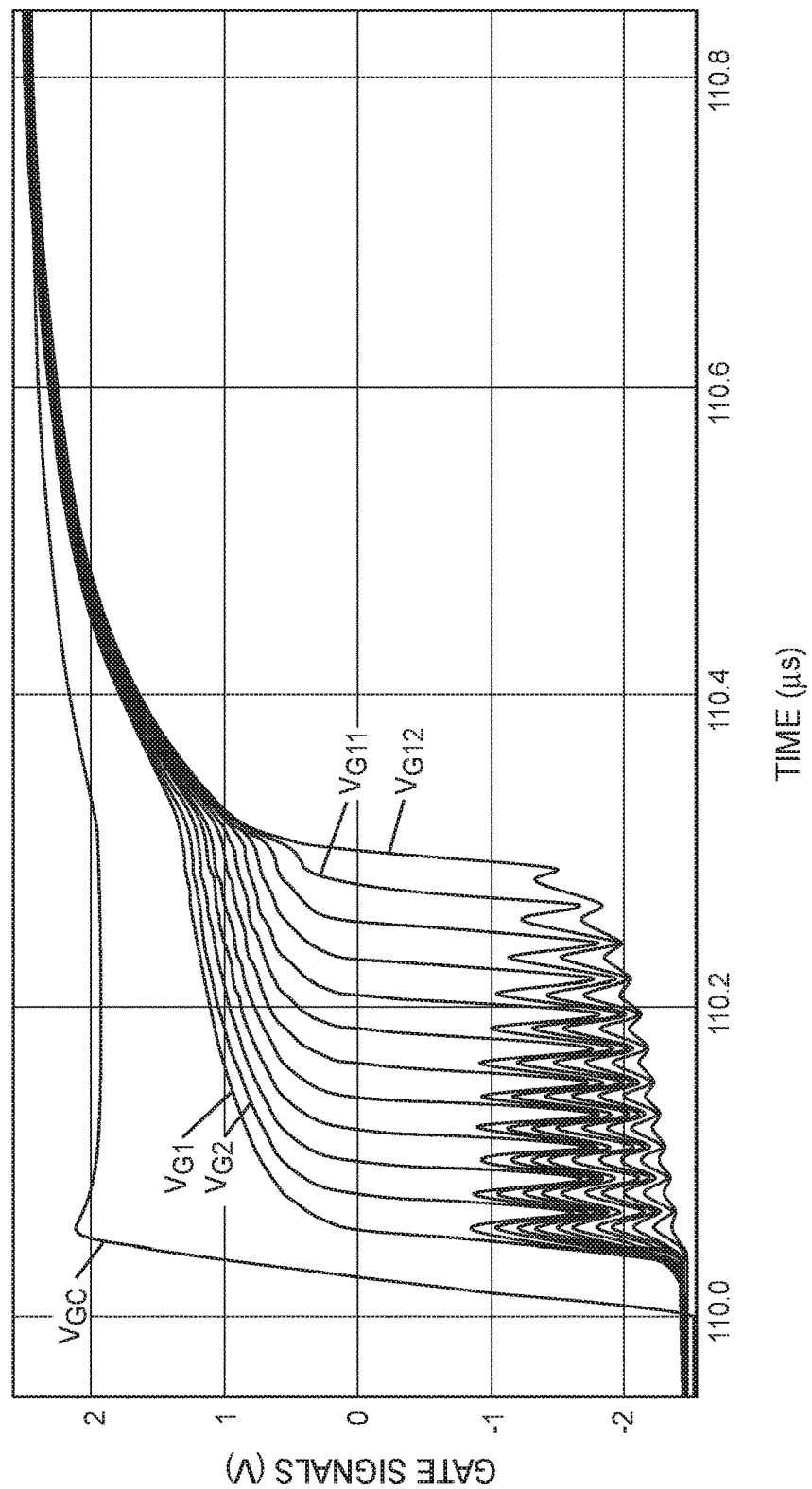
FIG. 4A is a graph showing the gate voltages of an exemplary 12-switch stack according to an embodiment of the subject matter described herein.

FIG. 4A is a graph showing the gate voltages of an exemplary 12-switch stack according to an embodiment of the subject matter described herein. At the turn-on of the main switch FET stack via the gate control signal GC, shown in FIG. 4A as VGC, the individual FETs turn on one after the other. FIG. 4A shows the waveforms of the individual gate control signals VG1, VG2, . . . VG11, and VG12, when acceleration switches SRG are used. In such a case, the turn-on speed of the switch branch is relatively fast once the SRG switches turn on. In a traditional configuration, this speed is much smaller, resulting in long turning on. The global gate control signal GC at the input of the gate bias resistor ladder jumps close to the 2.x V voltage level very fast, limited by its parasitic time constant. The individual gate control signals have growing delay times based on the place they are in the FET stack.

Figure 4B:
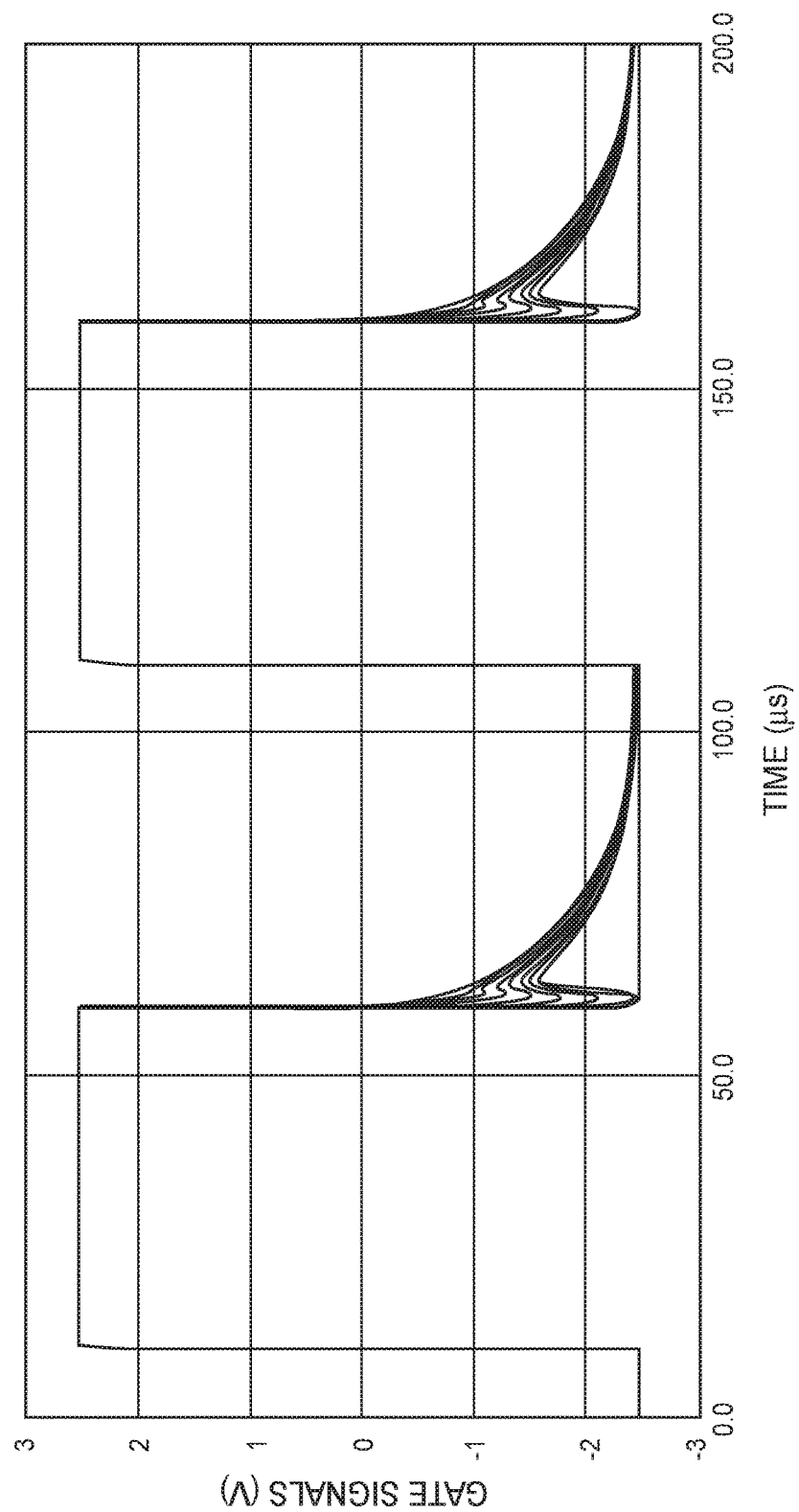
FIG. 4B is a graph showing the turning-on and turning-off waveforms of an exemplary switch according to an embodiment of the subject matter described herein.

FIG. 4B is a graph showing the turning-on and turning-off waveforms of an exemplary switch according to an embodiment of the subject matter described herein. FIG. 4B illustrates the point that the turning-on is much accelerated using the PFET acceleration auxiliary switches of the present disclosure, whereas the turning-off is still relatively slow in comparison to the turn-on time. In FIG. 4B, VGC drops quickly to −2.5 Volts, but VG12 takes about 50 µS to reach the same value. Different circuit topology would be needed to speed up the turning-off of the main switch. One example is shown in FIG. 5.

Figure 5:
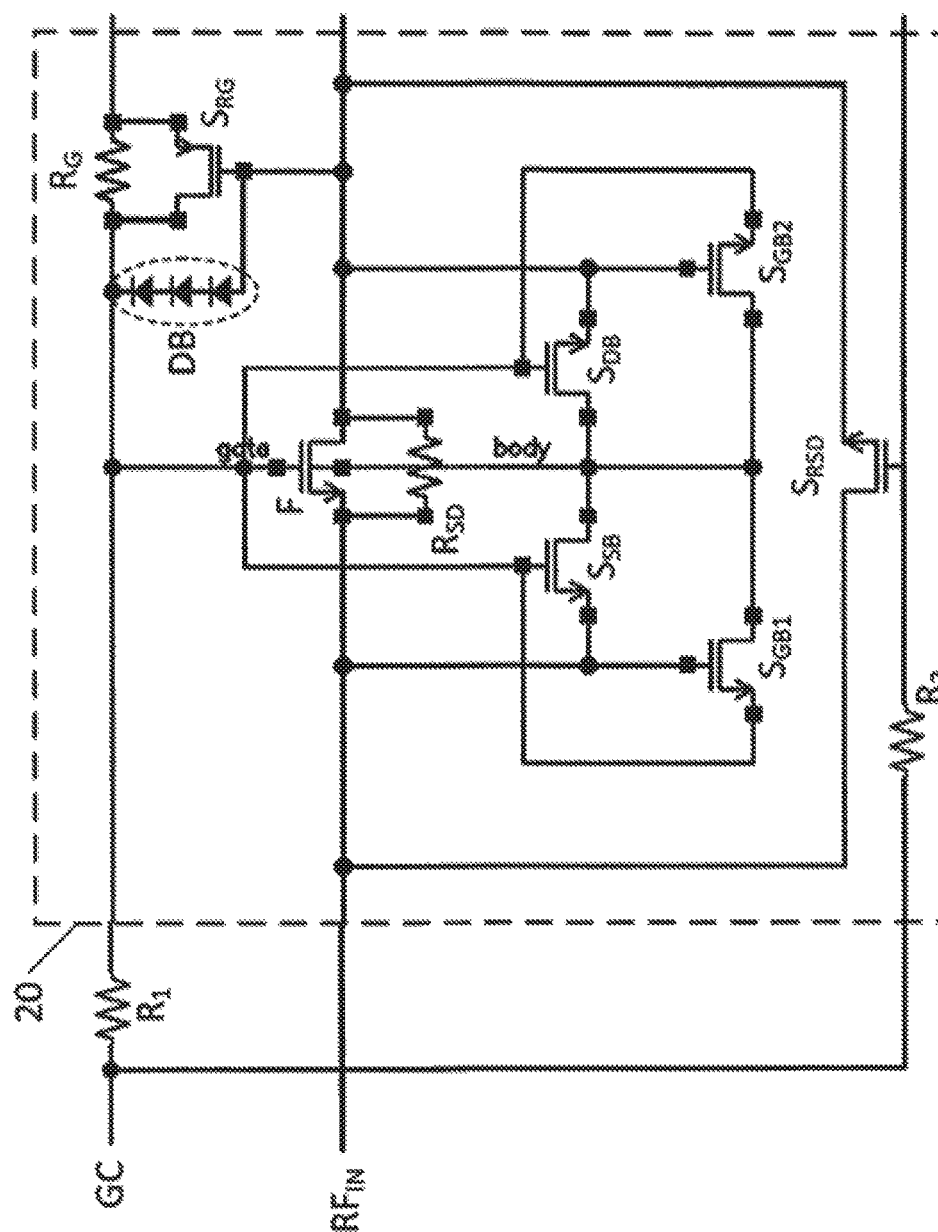
FIG. 5 shows an exemplary stage for use in an RF switch branch and having a turn-on switching acceleration network according to another embodiment of the subject matter described herein.

FIG. 5 shows an exemplary stage 20 for use in an RF switch branch and having a turn-on switching acceleration network according to another embodiment of the subject matter described herein. In the embodiment illustrated in FIG. 5, turn-off is accelerated by providing a low resistivity path to discharge the intermediary nodes between the stacked FETs of the main switch. To achieve this goal, each acceleration PFET SRG has a stacked diode branch DB connected in parallel with its gate, which ensures a path for the discharging current. The diodes are off during most of the operation, except when they need to discharge the local nodes when the PFET acceleration switches are turning off. There are other ways to implement the discharge branches, including various numbers of stacked diodes and also connecting them to different nodes in the structure. The configuration in FIG. 5 is an embodiment that results in low loading of the circuit. Other configurations will be obvious to those skilled in the art and are considered to be within the scope of the present disclosure.

It is desirable to minimize the number of external control signals needed to turn on and turn off the main switch. This is because any additional control signal may require a separate resistor bias network that further loads the main switch and degrades its Q and potentially increase its insertion loss. In the stage 20, for example, switches SRG, SSB, SDB, SGB1, and SGB2 are controlled by signals from existing internal nodes and do not require additional control signals. However, in some cases, additional control signals are needed, one such example being an anticipative control signal ahead in time from the main control signal, such as the control signal for SRSD, or an overdriven control signal with a different amplitude profile. In such cases, a more complex local switching network would be used.

In general, the local bulk switching network and the local acceleration switching network may be merged, and may share one or several switches. This reduces the overall complexity and simplifies the layout implementation. Furthermore, the bias resistor network may also be simplified. For example, a single switch may be used to electrically connect the gate to the body, rather than the pair of switches SGB1 and SGB2 shown in FIG. 5.

The present disclosure provides for, but is not limited to, the following:

A main switch having one or multiple stacked switching devices and a corresponding bias resistor network for the gates and drain/sources of the stacked devices and a switching acceleration circuit consisting of one or multiple auxiliary switches that are shorting the gate bias resistor ladder elements and/or the drain/source bias resistor elements;

using local PFETs connected with drain and source in parallel with the elements of the gate resistor ladder and the gate biased directly from the main switch stack;

using local NETs connected in parallel with the local drain-source resistors and having an anticipative control signal at the gate that changes state ahead in time of the main switch local gate control signal;

sharing the drain-source resistor shorting switches with the body local switching network, that is bulk-source and bulk-drain sharing switches;

using acceleration diodes to discharge the local nodes in the network when the auxiliary switches are turned off;

using the system for switches with one terminal grounded and for floating switches, including the particular case of differential switches; and using the system for signal switching, capacitor switching, resistor switching, inductor switching, or any other element switching.

The embodiments described above improve the turn-on and turn-off times of an RF switch while maintaining a high Q value. An additional optimization may be used to improve high power handling with no DC bias loss while the switch is in the off state.

Figure 6:
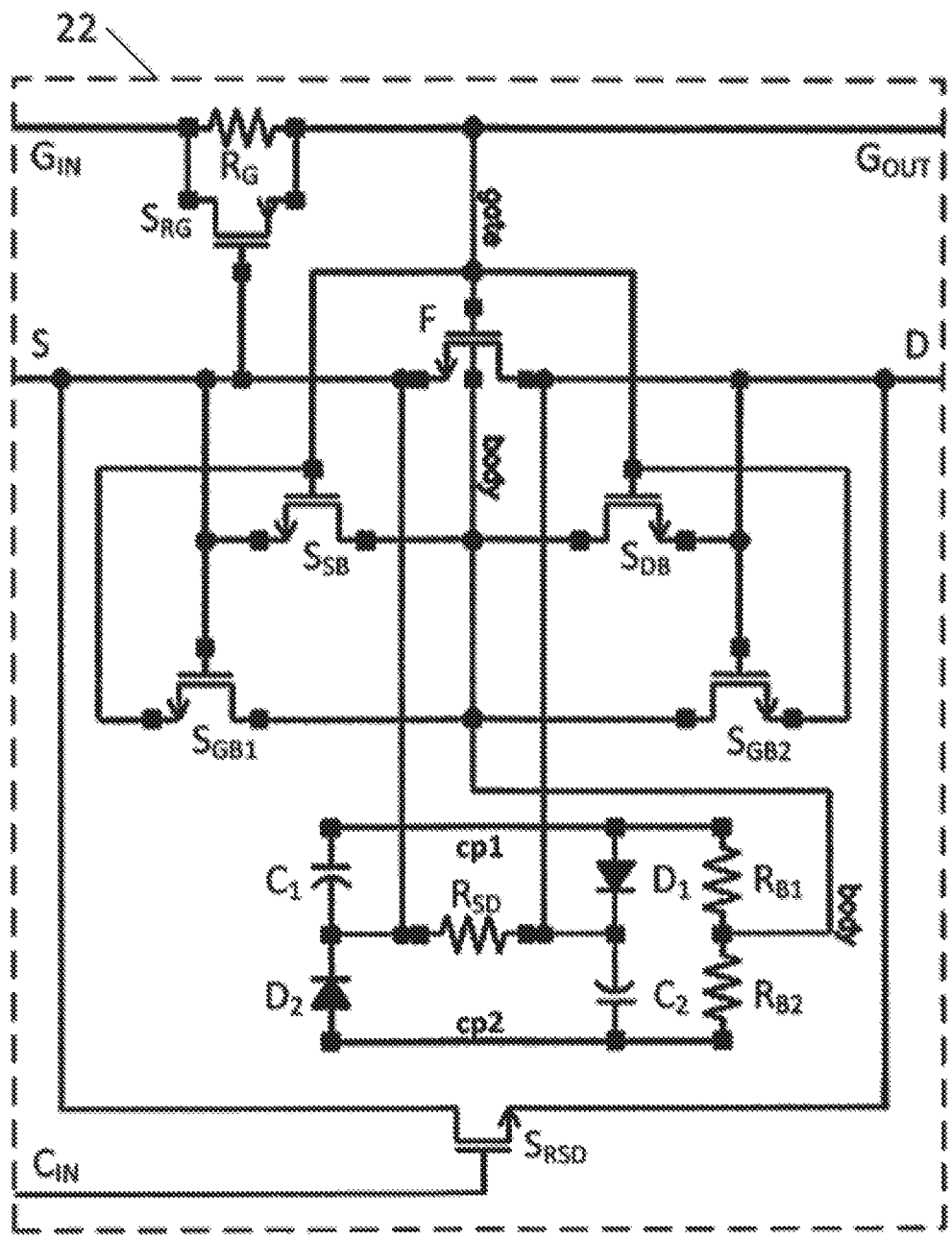
FIG. 6 shows an exemplary stage for use in an RF switch branch and having a circuit for providing local body bias according to an embodiment of the subject matter described herein.

FIG. 6 shows an exemplary stage 22 for use in an RF switch branch and having a circuit for providing local body bias according to an embodiment of the subject matter described herein. In the embodiment illustrated in FIG. 6, the stage 22 includes a main switch, FET F, having a source terminal S and a drain terminal D. The features GIN, GOUT, RG, SRG, SSB, SDB, SGB1, SGB2, RSD, and SRSD are identical to the like-named elements in FIG. 5; therefore, their descriptions will not be repeated here, except that in the embodiment illustrated in FIG. 6, the source-drain resistor bypass switch SRSD is controlled by a separate control signal CIN, which may be derived from GIN or may be completely independent from GIN. In one embodiment, the stage 22 may include a COUT terminal (not shown) for passing the control signal CIN on to the next stage in the series. It is noted that in embodiments that do not include a source-drain resistor RSD, switch SRSD may also be omitted.

In the embodiment illustrated in FIG. 6, however, the stage 22 includes additional components capacitors C1 and C2, diodes D1, and D2, and resistors RB1 and RB2, which, (together with RSD, if present) operate to actively bias the body terminal of the FET F, as will be explained in more detail below. The circuit comprising C1, C2, D1, and D2 (and RSD, if present) may be referred to herein alternatively as "the rectification circuit," "the charge pump," or "the local body bias circuit."

In summary, the switch SRG operates as a gate resistor short; switches SSB and SDB provide a body-source/drain connection when switch F is in the on state; switches SGB1 and SGB2 provide a body-gate connection when switch F is in the off state; and the rectification circuit provides a local body bias.

It is noted that there is no conflict between power handling and Q at low RF bias, in which almost no DC current is flowing (i.e., less than nano-amperes). At a moderately high VDS, however, a body/drain current begins to appear. In conventional circuits without the rectification circuit shown in FIG. 6, the presence of this body/drain current at high VDS reduces the power handling of the branch.

Figure 7:
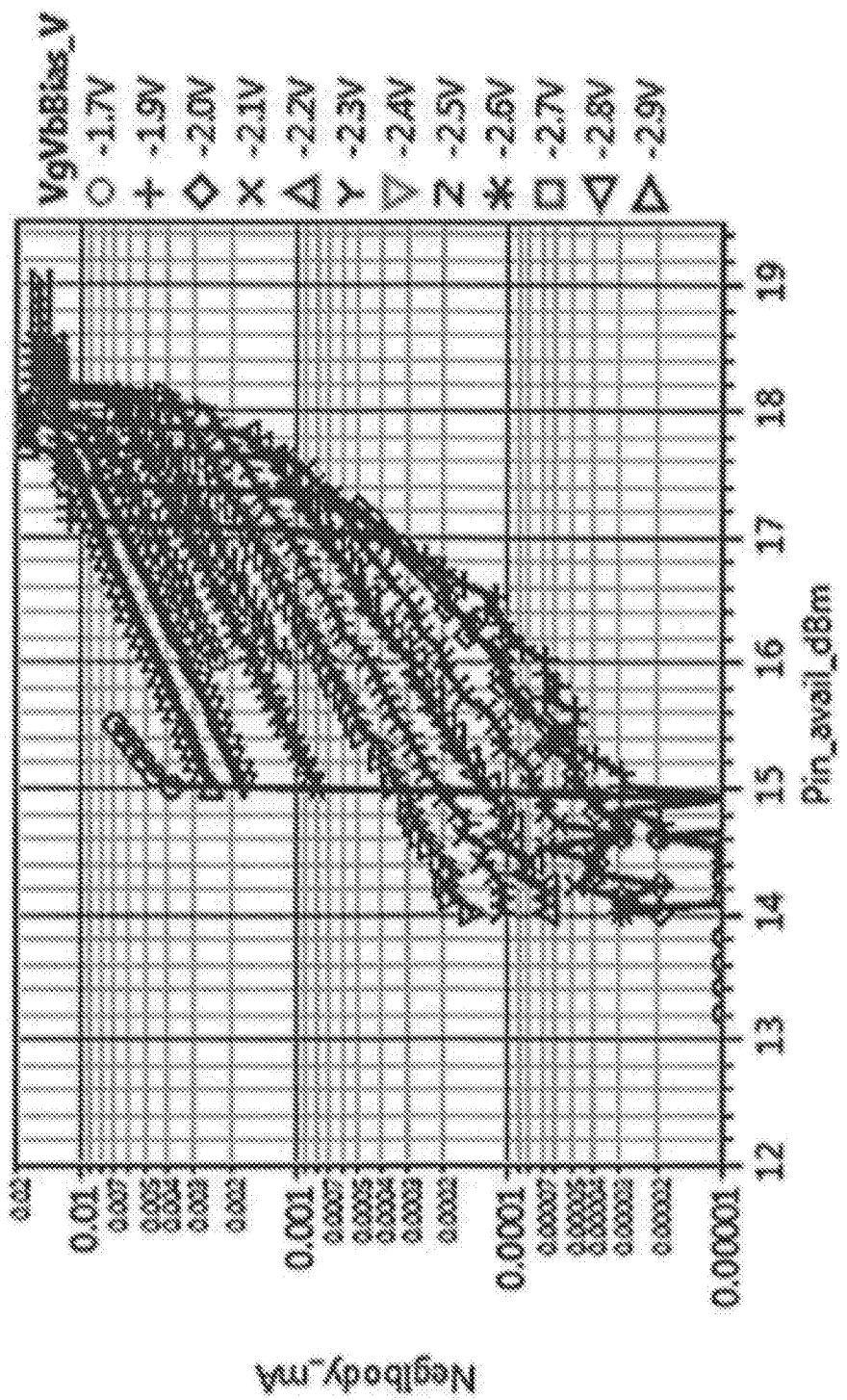
FIG. 7 is a graph showing body current produced in an off state branch when RF power is applied.

FIG. 7 is a plot showing body current produced in an off state branch when RF power is applied. The bias applied to both gate and body is the same and is labeled in the legend "VgVbBias_V" in volts. The branch is a single 4 mm transistor. The voltage across the FET is 3.5 V at an input power (PIN) of 15 dBm.

In contrast to conventional circuits, in the embodiment illustrated in FIG. 6, when a high VDS is present, the rectification circuit operates to transfer charge from the source/drain to the body, which completes the circuit started by the drain-body leakage. In this manner, a charge balance is restored locally at each transistor without reference to remote DC supplies. This mitigates or eliminates the effects of a DC current in a high-value resistor such as RSD.

Referring back to FIG. 6: in the off state, the voltage across RSD is the same as the voltage VDS across the switch F, and this voltage VDS is responsible for producing source/drain to body current. It is noted that VDS will be present with or without RSD. In the off state, the body is at a negative DC voltage, for example, −2.5 V, and the source/drain is at DC 0 V. The rectification circuit uses the VDS to "pump" the body to a more negative value as follows. If VDS=3.5 V, for example, capacitor C1 pulses the node cp1 to a more positive voltage by VDS, e.g., to +1 V. This causes a pulse of current to flow through diode D1 between body and source/drain, which lowers the DC bias of the body relative to the source/drain. On the other half RF cycle, capacitor C2 and diode D2 perform the same function. The resistors RB1 and RB2 connect to the body while isolating the cp1 and cp2 nodes from each other. Each of the diodes D1 and D2 may be a PN-junction diode or a diode-connected FET. The PN-junction diode has a turn-on of about 0.8 V, whereas the turn-on of the diode-connected FET depends on its threshold voltage. The reverse bias voltage across D1 or D2 can be fairly high, in the worst case of |VNEG|+VDS, so the diode-connected FET may not be appropriate from the standpoint of reliability. In the embodiment illustrated in FIG. 6, the rectification circuit is symmetrical about RSD to avoid second harmonic degradation.

In one embodiment, switch stages 14, 16, 18, 20, and 22 may be stacked to create a switch branch element. Other alternatives are also possible, such as the embodiments with multiple common resistors or different combinations of single stack elements. For example, a stage may have all of the following elements: a gate resistor bypass switch (e.g. SRG); source to body or drain to body switches (e.g., SSB, SDB); gate to body switches (e.g., SGB1, SGB2); a source-drain resistor bypass switch (e.g., SRSD) and a rectification circuit (e.g., C1, C2, D1, D2, RB1, and RB2), such as the stage 22 shown in FIG. 6.

Not all of these features are required, however. For example, a stage may be similar to the stage 22 in FIG. 6 but without the gate resistor bypass switch SRG, without the source/drain to body switches SSB and SDB, without the gate to body switches SGB#, and/or without the source drain resistor bypass switch SRSD. Other embodiments having different combinations of these elements are also within the scope of the subject matter described herein. One such example is illustrated in FIG. 8.

Figure 1B:
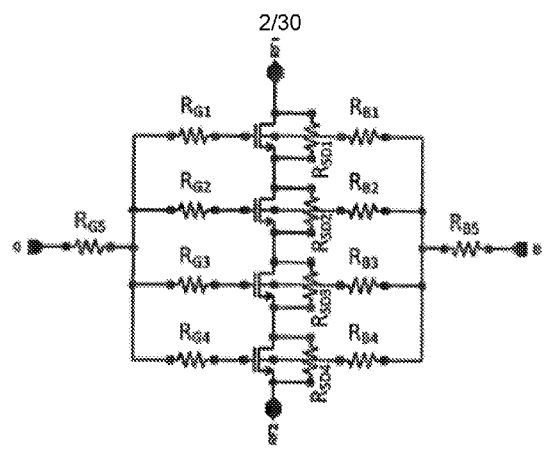
FIG. 1B shows a conventional RF switching branch having a parallel-connected resistor bias network.
Figure 1C:
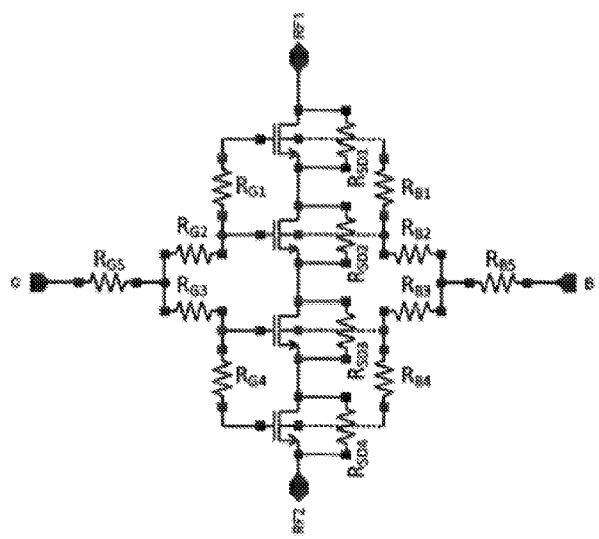
FIG. 1C shows a conventional RF switching branch having a tree-connected resistor bias network.
Figure 1D:
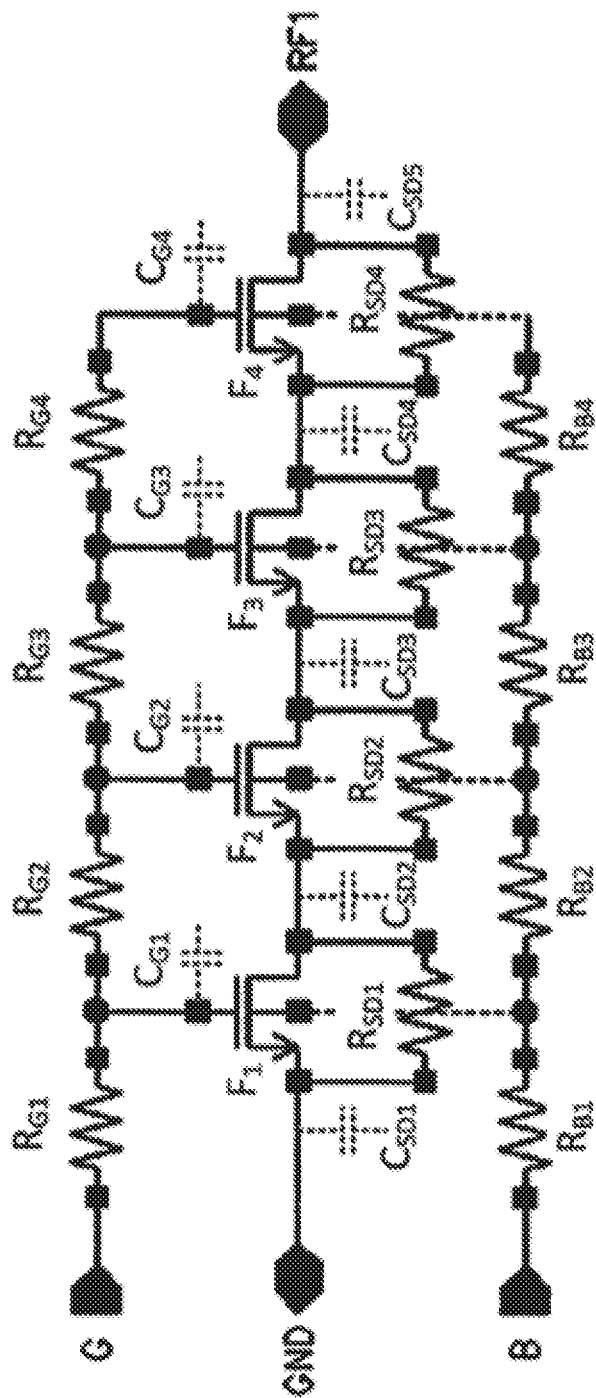
FIG. 1D shows the conventional RF switching branch configuration in FIG. 1A, additionally showing parasitic capacitances.
Figure 8:
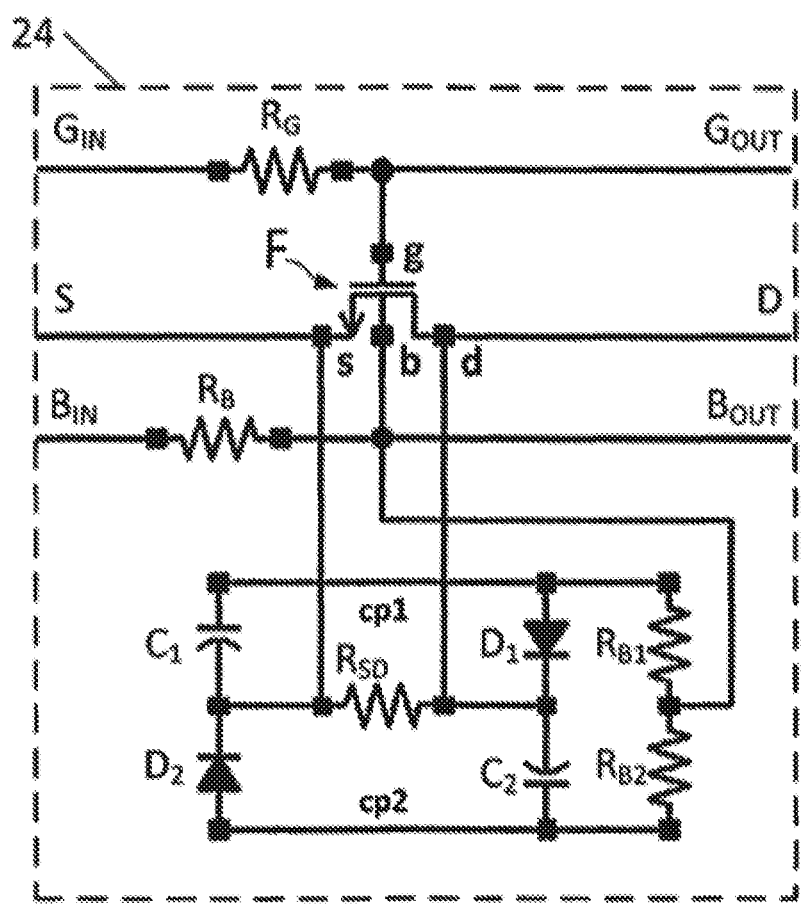
FIG. 8 shows an exemplary stage for use in an RF switch branch and having a circuit for providing local body bias according to another embodiment of the subject matter described herein.

FIG. 8 shows an exemplary stage 24 for use in an RF switch branch and having a circuit for providing local body bias according to another embodiment of the subject matter described herein. FIG. 8 illustrates the point that a stage may use the rectification circuit by itself, e.g., without the additional acceleration switches for bypassing the gate bias resistors RG, the switches for bypassing the source-drain bias resistors RSD, and/or the switches for connecting the source, drain, or gate to the body. As mentioned above, in some embodiments RSD may also be omitted. In the embodiment illustrated in FIG. 8, the features GIn, RG, GOUT, F, S, D, C1, C2, D1, D2, RSD, RB1, RB2, cp1, and cp2 are identical to the like-named elements in FIG. 6; therefore, their descriptions will not be repeated here. In the embodiment illustrated in FIG. 8, terminal BIN, resistor RB, and terminal BOUT provide a body bias resistor network for the stage 24. In other embodiments, the rectification circuit illustrated in FIG. 8 may be used with some or all of the switches SRG, SSB, SDB, SGB#, and SRSD shown in FIGS. 5 and/or 6. It is noted that the stage 24 may be used to construct switches having the same general topologies as the switches shown in FIGS. 1A, 1B, and 1C. For example, if the BOUT of stage N is connected to the BIN of stage N+1 and the GOUT of stage N is connected to the GIN of stage N+1, the topology of the switch in FIG. 1A is produced. If the GIN terminals of all stages are connected in parallel and the BIN terminals of all stages are connected in parallel while leaving the BOUT and GOUT terminals unconnected, the topology of the switch in FIG. 1B is produced. Likewise, the topology of the switch in FIG. 1C may also be produced by connecting the control signals appropriately.

Figure 9:
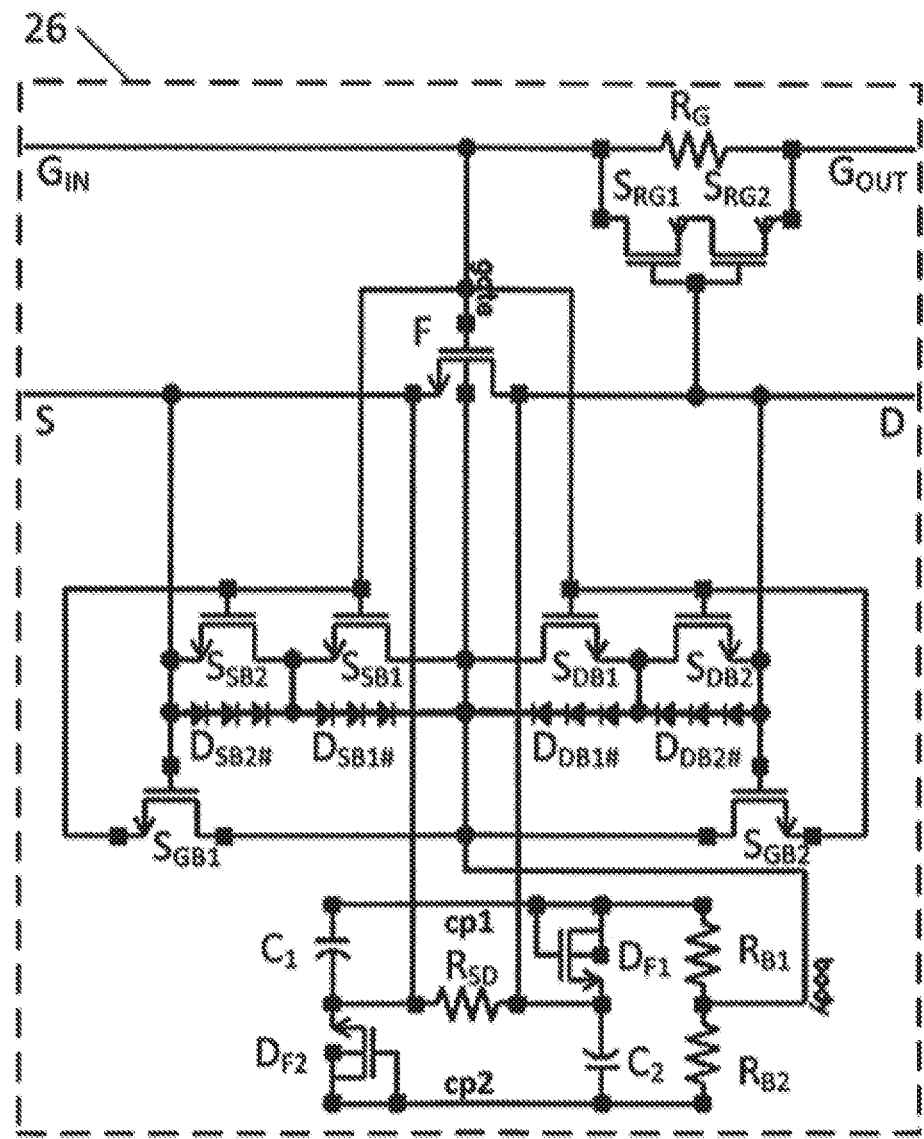
FIG. 9 shows an exemplary stage for use in an RF switch branch and having a circuit for providing local body bias according to another embodiment of the subject matter described herein.

FIG. 9 shows an exemplary stage 26 for use in an RF switch branch and having a circuit for providing local body bias according to another embodiment of the subject matter described herein. In the embodiment illustrated in FIG. 9, the stage 26 includes a main switch, FET F, having a source terminal S and a drain terminal D. The features GIN, GOUT, RG, SGB1, SGB2, RSD, C1, C2, RB1, and RB2 are identical to the like-named elements in FIG. 6; therefore, their descriptions will not be repeated here. The stage 26 in FIG. 9 differs from the stage 22 in FIG. 6 in a number of respects. Rather than using a single switch SRG, the stage 26 in FIG. 9 uses a pair of switches SRG1 and SRG2 connected in series. Likewise, the stage 26 in FIG. 9 uses a pair of switches SSB1 and SSB2 instead of the single switch SSB used by the stage 22 in FIG. 6. The stage 26 in FIG. 9 uses a pair of switches SDB1 and SDB2 instead of the single switch SDB used by the stage 22 in FIG. 6. The stage 26 in FIG. 9 includes additional diode sets DSB1#, DSB2#, DDB1#, and DDB2# to provide additional discharge paths to the body. In the embodiment illustrated in FIG. 9, each diode set contains three diodes in series, but other numbers of diodes are considered to be within the scope of the present disclosure. Finally, the stage 26 in FIG. 9 uses diode-connected FETs DF1 and DF2, rather than the PN junction diodes D1 and D2 used by the stage 22 in FIG. 6. The rectification circuit may use a PN junction diode, a diode-connected NFET, or a diode-connected PFET.

Figure 10:
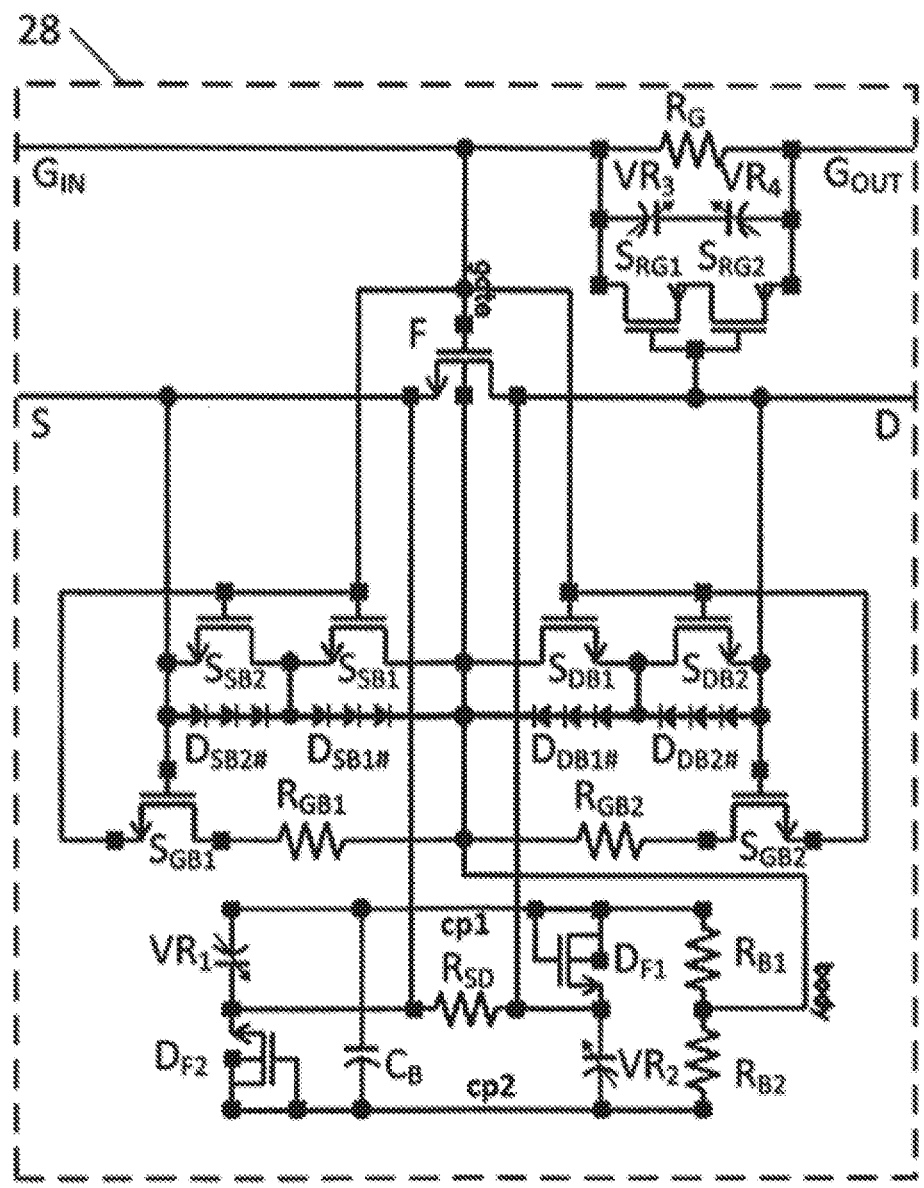
FIG. 10 shows an exemplary stage for use in an RF switch branch and having a circuit for providing body bias according to another embodiment of the subject matter described herein.

FIG. 10 shows an exemplary stage 28 for use in an RF switch branch and having a circuit for providing body bias according to another embodiment of the subject matter described herein. In the embodiment illustrated in FIG. 10, the features GIN, RG, GOUT, SRG1, SRG2, F, S, D, SSB1, SSB2, SDB1, SDB2, SGB1, SGB2, RSD, DF1, DF2, RB1, RB2, cp1, and cp2 are identical to the like-named elements in FIG. 9; therefore, their descriptions will not be repeated here. In the embodiment illustrated in FIG. 10, the stage 28 includes additional resistors RGB1 and RGB2 in series with switches SGB1 and SGB2, respectively.

In the embodiment illustrated in FIG. 10, the stage 28 includes Metal Oxide Semiconductor (MOS) varactors VR1 and VR2 are used in place of the capacitor elements C1 and C2 used in the stage 26 in FIG. 9. Along with the diode-connected FETs DF1 and DF2, varactors VR1 and VR2 serve to boost the body bias when a large voltage is present across terminals S and D. The varactors VR1 and VR2 along with linear capacitor CB also serve as body linearization. In the embodiment illustrated in FIG. 10, varactors VR3 and VR4 are used with switches SRG1 and SRG2 for gate linearization. Diode groups DSB1#, DSB2#, DDB1#, and DDB2# provide additional discharge paths, where each group may comprise one or more diodes. In the embodiment illustrated in FIG. 10, for example, each diode group includes three diodes connected in series, but other configurations are within the scope of the subject matter claimed.

In an alternative embodiment, multiple FETs in series having the same gate bias may be used instead of a single FET. Thus, single switch SRG could be replaced by multiple switches SRG#, single switch SSB could be replaced by multiple switches SSB#, single switch SDB could be replaced by multiple switches SDB#, and so on. Another alternative is to place the rectification circuit across more than one transistor. The capacitor and diode may be connected to each other across more than one transistor in the stack. This allows the rectification to occur at a lower VDS (because the circuit now rectifies n×VDS, where n is the number of FETs that separates the varactor and diode). Yet another alternative embodiment also includes off state harmonic linearization. Other alternatives will be obvious to those skilled in the art, and are considered to be within the scope of the present disclosure.

Figure 11A:
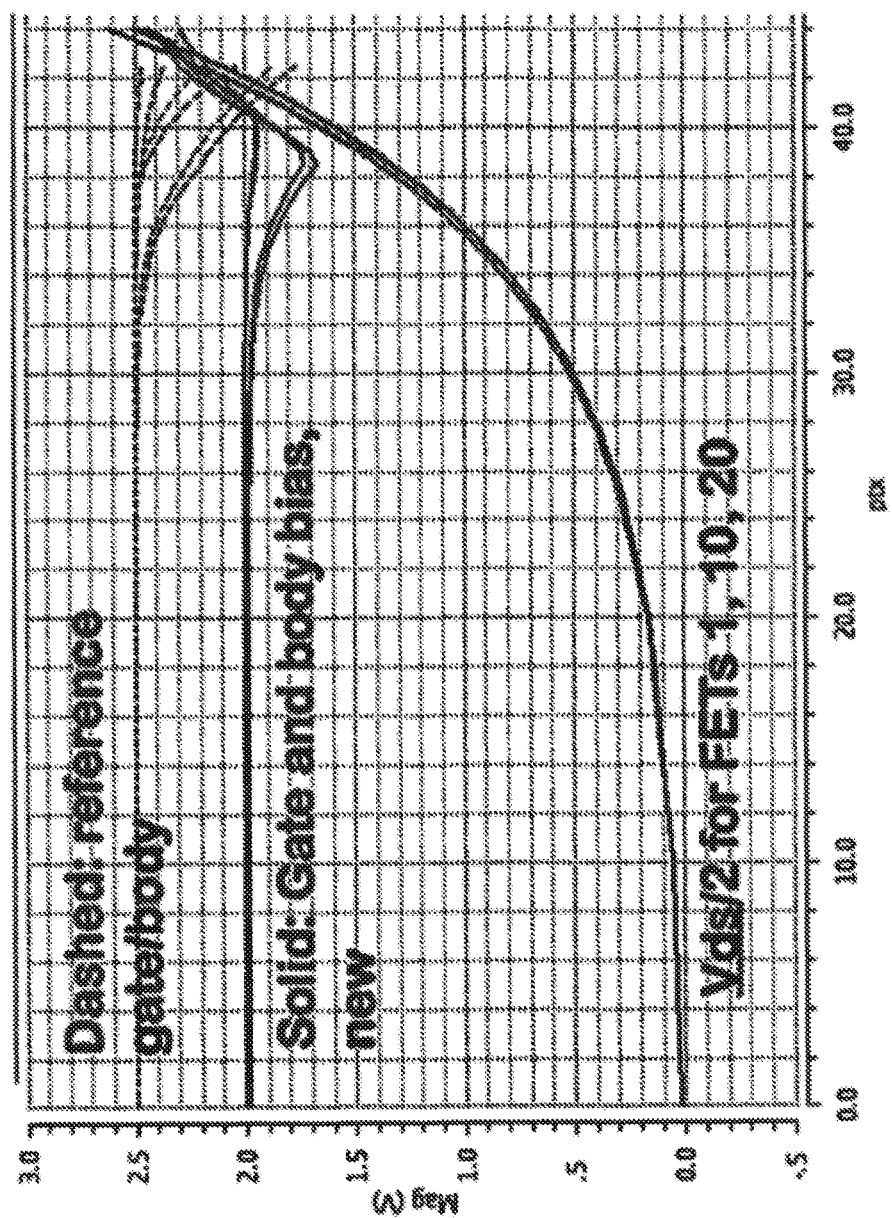
FIGS. 11A and 11B are graphs of simulation results of an RF switch comprised of stages having a circuit for providing local body bias according to an embodiment of the subject matter described herein.
Figure 11B:
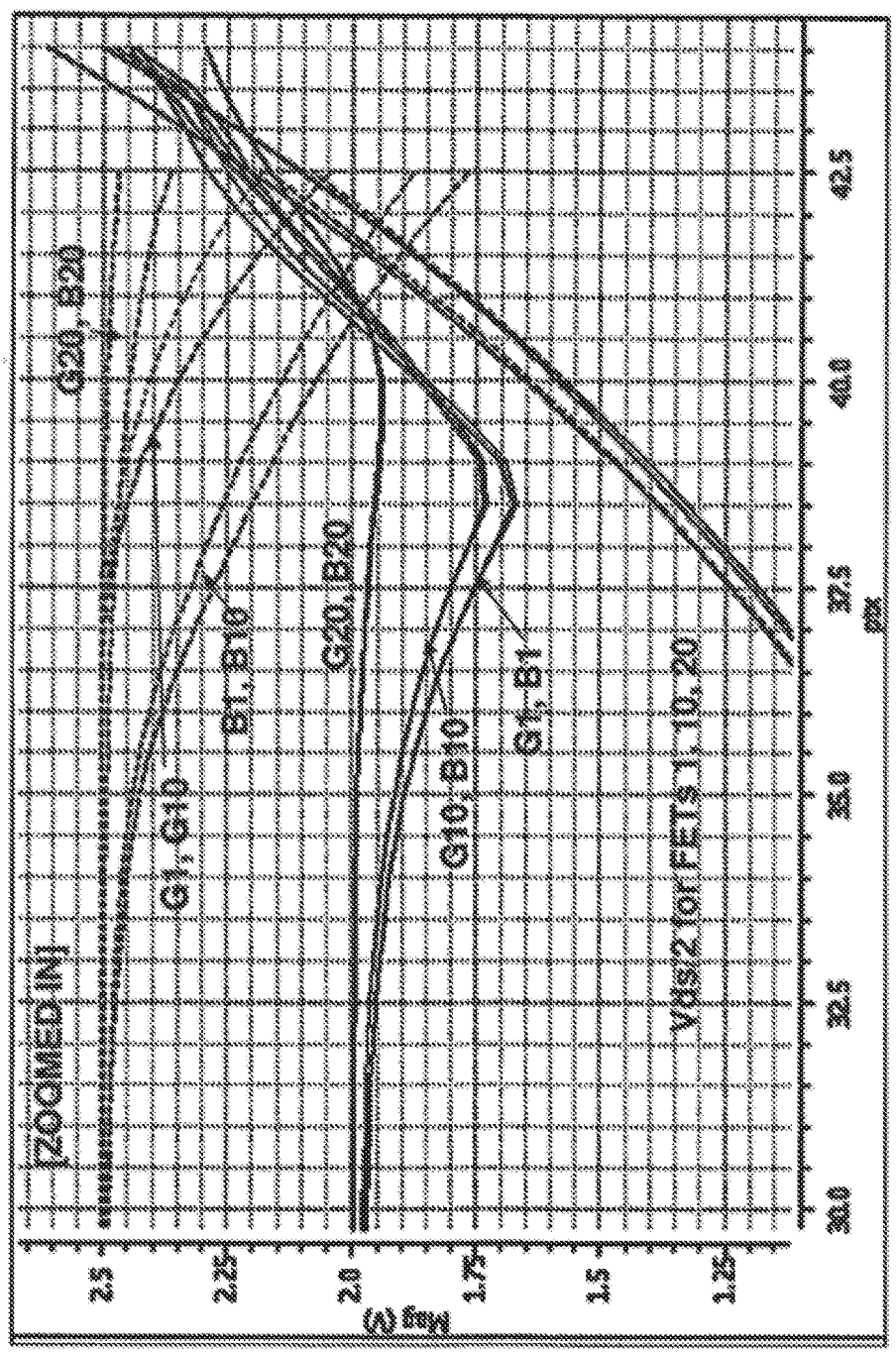

FIGS. 11A and 11B are graphs of simulation results of an RF switch comprised of stages having a circuit for providing local body bias according to an embodiment of the subject matter described herein. FIG. 11B is a portion of the graph in FIG. 11A, magnified to show detail. FIGS. 11A and 11B are plots of a simulation result from a shunt branch comprising multiple instances of the stage 22 in FIG. 6 versus a shunt branch comprising the same number of instances of a conventional stage. A periodic steady-state simulation was performed for swept power levels indicated on the x-axis in units of decibel-milliwatts. The y-axis is in units of voltage. The DC bias applied to the gate and body of the conventional stages is −2.5 V, while the DC bias applied to the gate and body of the improved stages is −2.0 V, so that the two sets of plots would be separated for easier viewing and comparison. (It should be noted that the results described below for the improved stages would be the comparable with application of a −2.5V DC bias.)

In FIG. 11A, the traces in the lower portion of the graph show peak VDS voltage divided by two in order to show how they approach the gate and body voltages; the gate and body voltages are floating relative to VDS/2. The two sets of traces in the upper portion of the graph show the absolute value of DC gate and body voltages (the actual gate and body voltages are negative in this circuit). The upper traces with solid lines show gate and body voltages for a stage that includes the local body bias circuit according to an embodiment of the subject matter described herein, and the upper traces with dashed lines show the gate and body voltages for a conventional stage that does not include a local body bias circuit. It can be seen from FIG. 11A that the presence of the local body bias circuit does not change the values of VDS significantly compared to the conventional stage.

In FIG. 11B, however, the performance of the stage having the local body bias circuit shows marked improvement. For clarity, the voltages for just three of the twenty stages—the 1st stage, the 10th stage, and the 20th stage—are shown. The 1st stage is closest to the RF power input, the 10th stage is in the middle of the branch, and the 20th stage is closest to ground.

Looking at the dashed lines in the upper portion of the graph in FIG. 11B, which represent the performance of a conventional stage, it can be seen that when ptx>32 dBm, the body and gate voltages begin to drop. This is because the body current causes a voltage drop in the resistors and de-biases the body and gate. Once the body voltage or gate voltage drops below VDS/2, the stage (and switch) will no longer operate. For the conventional stages, this occurs at approximately 41 dBm.

In contrast, the solid lines in the middle portion of the graph in FIG. 11B, which represent the performance of the stage having a local body bias circuit according to an embodiment of the subject matter described herein, show a similar drop, but only until VDS reaches about 1.65V (ptx is about 38.5 dBm), at which point the local body bias circuit begins to operate. As ptx increases, VDS increases; as VDS increases, the rectifier circuit begins to drive the body bias more and more strongly negative. This is most clearly evident in the solid line labeled "G1, B1": as ptx increases above 38.5 dBm, the magnitude of these voltages continues to increase with the result that they continue to stay above VDS/2 beyond the 41 dBm limit of the conventional circuit.

Additional simulation results were performed as summarized using the same FET and resistor sizes:

TABLE 2

Additional Simulation Results

| Item tested | Result |
| --- | --- |
| Q versus input power | Q is not degraded by the body rectification circuit for low power, up to the power at which the circuit begins to inject current into the body node. |
| Time response of the body rectification circuit | A transient simulation was performed in which the RF power level was abruptly increased. The body rectification circuit was able to follow this increased power level in less than 0.1 μs, settling in <0.5 μs. |
| Harmonics | Neither on- nor off state harmonics were affected by this circuit. |
| Figure of Merit | Figure of merit is increased (degraded) by approximately 10% with this circuit. |
| Off state Q | Off state Q is degraded by 20% with this circuit. |
| Voltage handling | Voltage handing is improved by 20 V with this circuit. |

Note that when comparing circuits with identical voltage handling, this circuit has improved Q. In addition, performance could be adjusted for higher VB and tuned for harmonics and Coff.

Figure 12:
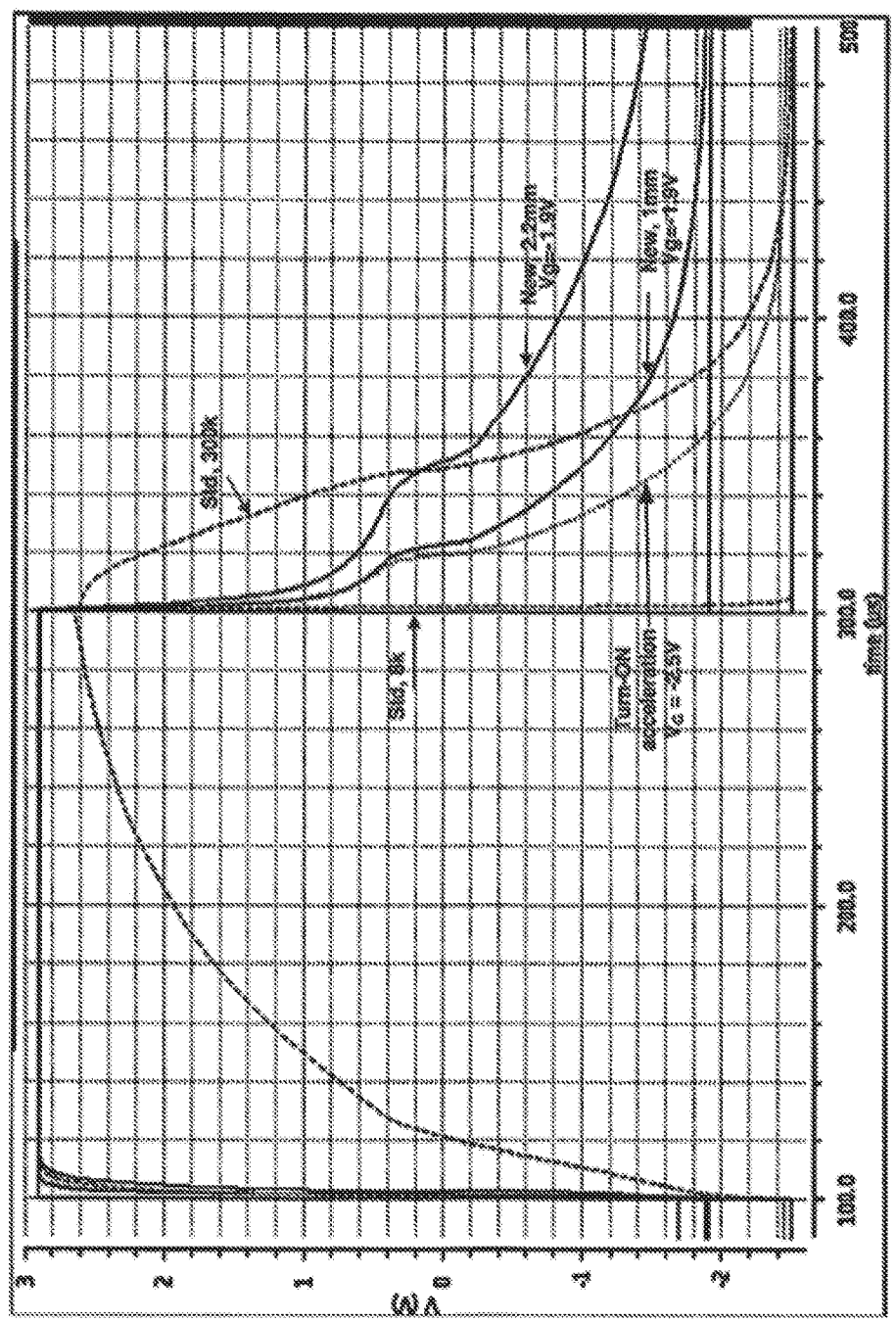
FIG. 12 is a graph showing response time of a switch having stages according to embodiments of the subject matter described herein.

FIG. 12 is a graph showing response time of a switch having stages according to embodiments of the subject matter described herein. FIG. 12 is a plot that shows the VG of the first FET in a stack. Bias is connected to the last FET in a stack of 20, so the first FET is the slowest to respond. FIG. 12 demonstrates that gate-shorting FETs are effective in reducing the off-to-on transient, and also help shorten the on-to-off transient up to the transistor threshold (this is approximately the small-signal switching time). For fast on-to-off large signal switching time, use higher VGoff (or higher |VGoff| for a limited time to overdrive gate low), and/or use a smaller gate resistor. Note that with a body boost circuit and large input signal, body bias goes low faster than the DC bias network. In FIG. 12, voltages labeled "Std" are for switches with conventional stages (i.e., no switching acceleration, no local body bias circuit); voltages labeled "Turn-on acceleration" are for switches with turn-on switching acceleration networks according to an embodiment of the subject matter described herein (e.g., the stage 14 in FIG. 3A and similar); and voltages labeled "New" are for switches having turn-on switching acceleration networks and local body bias circuits (e.g., the stage 22 in FIG. 6 and similar).

Simulations of stages according to embodiments of the subject matter disclosed herein demonstrated that on state harmonics are similar to conventional stage designs, that the extra components of the improved stages are mostly shorted out and have little effect. There is only a 2 dB difference in H2; H4 and H5 levels were very low, very similar to conventional stages.

Regarding the comparison of stages having acceleration networks only versus stages that also included the local body bias circuit, simulations indicate the following: the latter has lower off state H2 due to high resistor values; the latter has much lower off state H3 due to gate/body linearization varactors circuits; the latter has much higher H4 and H5 in simulation, but still at very low levels; and finally, that, compared to the relatively smooth response curves of the former, the latter's response curves are "bumpy," due to the effects of the gate resistor bypass switches at low power and the effects of the gate linearization circuit bias change at 37 dBm and higher power levels.

Figure 13:
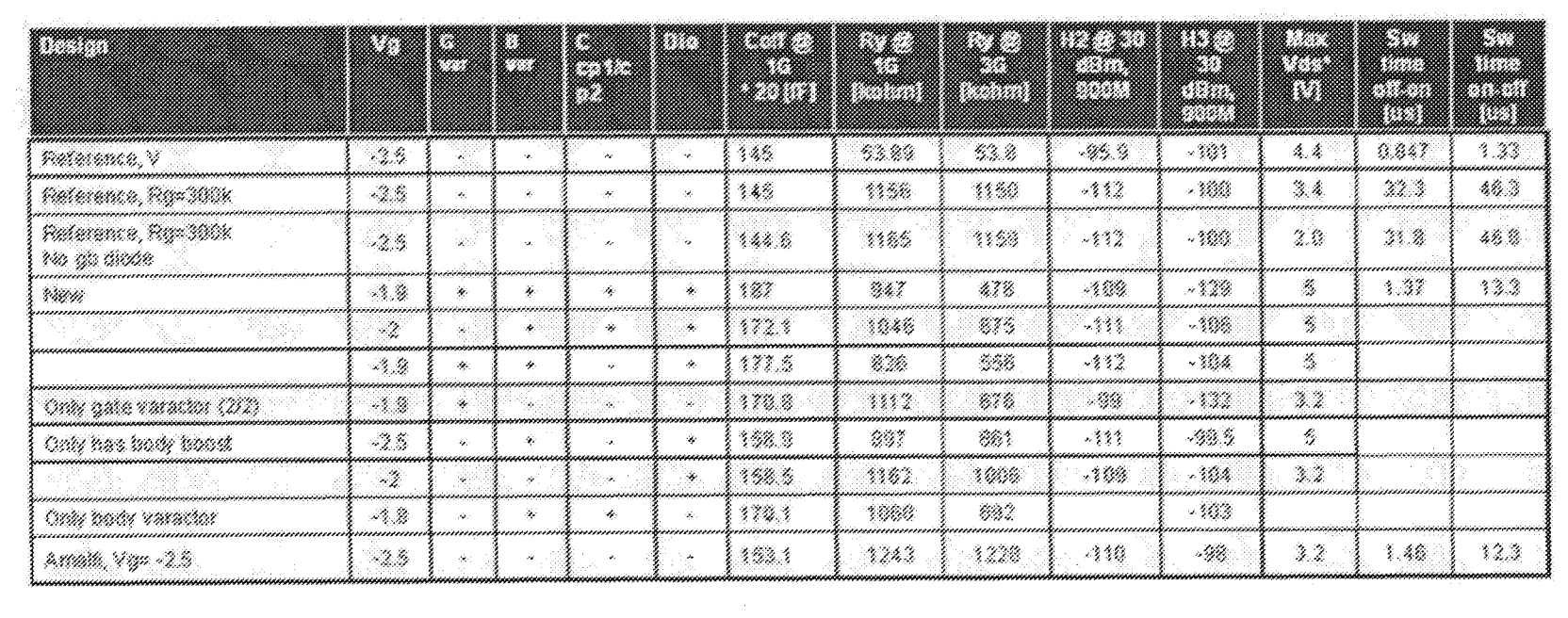

FIG. 13 is a table comparing values for reference designs and various embodiments according to the subject matter disclosed herein. It was determined that VG affects Coff and that there is a trade-off between Coff and VBD.

The following was found in regard to reliability. The diodes in the local body bias circuit can be subject to relatively high reverse bias, for example, −2.5–4 V=−6.5 V. This may be too high for a reliable gate oxide for some types of gated diode, which may or may not have a floating gate. Depending on the particular structure used, this high field may be divided across source-gate and drain-gate areas of the layout, or it may be concentrated only in the drain-gate area. The contact space for a gated diode may be significantly smaller than for a non-gated diode, which affects layout and density. A diode-connected FET is similar to a gated diode with a connected gate, but may not be able to support a high reverse bias of 6.5 V. In the processes studied, non-gated diodes were found to have the lowest on-resistance, while diode-connected FET were found to have the lowest turn-on voltage (0.4 V versus 0.75 V for 1 μA).

Figure 14:
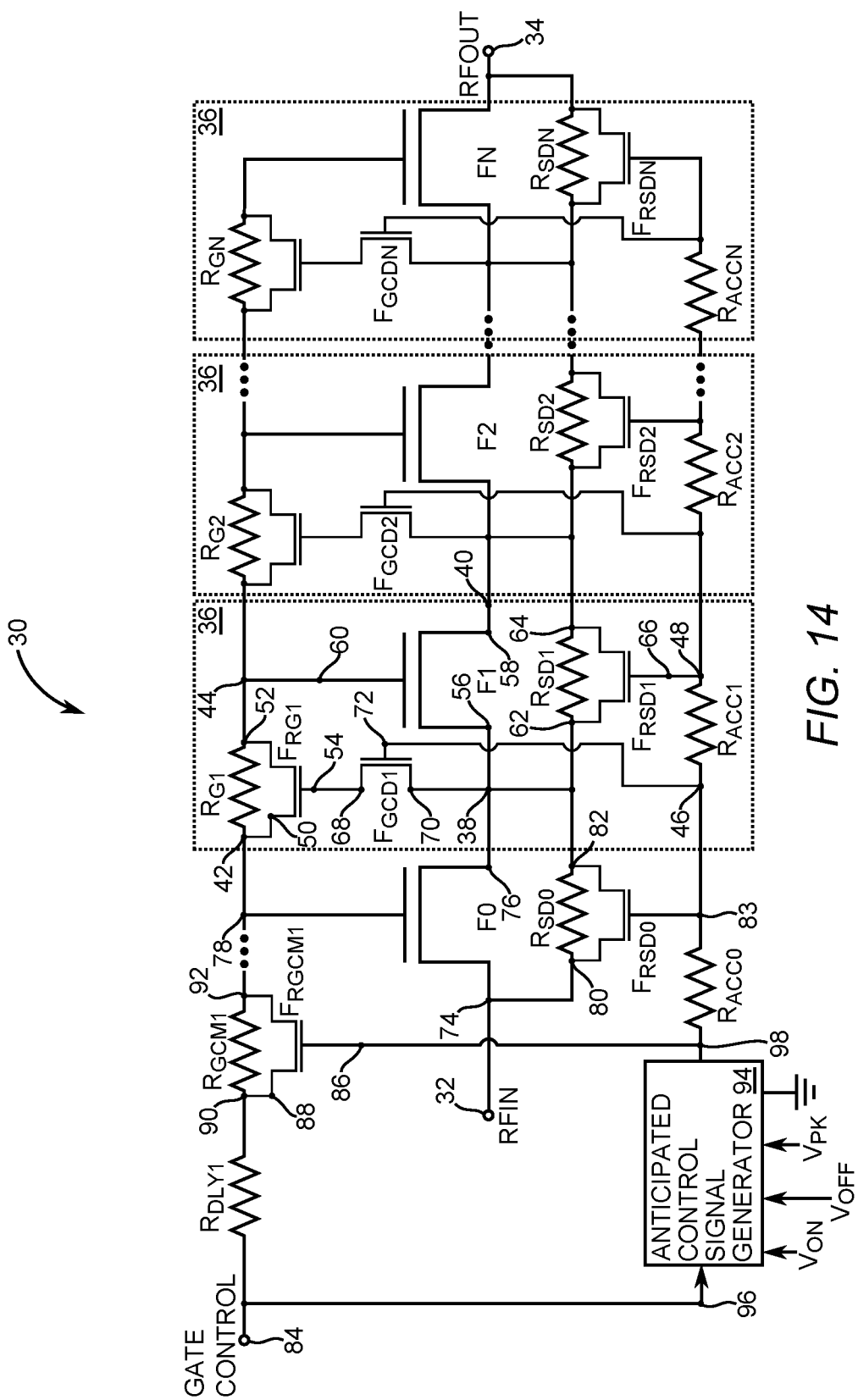
FIG. 14 is an exemplary radio frequency (RF) switch that generates an anticipation control signal that provides addition control over speeding up the turning on and the turning off of the RF switch.

FIG. 14 is an exemplary RF switch 30 that provides addition control over speeding up the turning on and the turning off of the RF switch 30. The RF switch 30 has an RF input terminal 32 and an RF output terminal 34 with two or more stages 36 coupled in series. Each of the two or more stages 36 has a signal input 38 communicatively coupled to the RF input terminal 32 and a signal output 40 communicatively coupled to the RF output terminal 34. The two or more stages 36 also each include a control input 42, a control output 44, an acceleration input 46, and an acceleration output 48.

An acceleration resistor $R_{ACC\#}$ is coupled between the acceleration input 46 and the acceleration output 48. A gate resistor $R_{G\#}$ is coupled between the control input 42 and the control output 44.

A first FET $F_{RG\#}$ has a first current terminal 50 coupled to the control input 42 and a second current terminal 52 coupled to the control output 44 to shunt the gate resistor $R_{G\#}$ when the first FET $F_{RG\#}$ is on. The first FET $F_{RG\#}$ has a first control terminal 54 for controlling an on/off state of the first FET $F_{RG\#}$.

An RF switching device F# has a third current terminal 56 coupled to the signal input 38 and a fourth current terminal 58 coupled to the signal output 40 to pass an RF signal between the signal input 38 and the signal out 40 when the RF switching device F# is on. A second control terminal 60 is coupled to the control output 44 for controlling an on/off state of the RF switching device F#. The RF switching device F# is a FET in this exemplary embodiment. However, it is to be understood that the RF switching device F# is not limited to a particular type of transistor. For example, the RF switch device F# can be a metal oxide semiconductor Field-Effect Transistor (MOSFET), a high electron mobility transistor (HEMT), and a bipolar junction transistor (BJT). Moreover, the RF switching device F# can be a N-channel, P-channel, NPN, or PNP type transistor.

A second FET $F_{RSD\#}$ has a fifth current terminal 62 coupled to the signal input 38 and a sixth current terminal 64 coupled to the signal output 40 for shunting the RF switching device F# when the second FET $F_{RSD\#}$ is on. A third control terminal 66 is coupled to the acceleration output 48 for controlling an on/off state of the second FET $F_{RSD\#}$.

A third FET $F_{GCD\#}$ has a seventh current terminal 68 coupled to the first control terminal 54 and an eighth current terminal 70 coupled to the signal input 38 for controlling charge on a gate of the first FET $F_{RG\#}$. A fourth control terminal 72 is coupled to the acceleration input 46 for controlling an on/off state of the third FET $F_{GCD\#}$.

The signal input 38 of a first stage of the stages 36 is communicatively coupled to the RF input terminal 32, and the signal output 40 of a last stage of the stages 36 is communicatively coupled to the RF output terminal. The last stage is the Nth stage as depicted in FIG. 14. Moreover, the signal output 40 of a proceeding one of the stages 36 is coupled to the signal input 38 of a following one of the stages 36 such that the stages 36 are coupled in series to stack the RF switching devices F#. Further still, the control output 44 of a proceeding one of the stages 36 is coupled to a control input 42 of a next following one of the stages 36 such that the gate resistors $R_{G\#}$ are coupled into a series gate resistor network. Also, the acceleration output 48 of a proceeding one of the stages 36 is coupled to the acceleration input 46 of a next following one of the stages 36 such that the acceleration resistors $R_{ACC\#}$ are coupled in series to form a series accelerator resistor network.

The RF switch 30 also includes a lead RF switching device F0 having a ninth current terminal 74 coupled to the RF input terminal 32, a tenth current input 76 coupled to the signal input 38 of a first stage of the stages 36. The lead RF switching device F0 also includes a fifth control terminal 78 that is coupled to the control input 42 of the first stage of the stages 36. The lead RF switching device F0 is typically the same size and type as the RF switching device F# included in the stages 36.

The RF switch 30 further includes a fourth FET $F_{RSD0}$ having an eleventh current terminal 80 coupled to the RF input terminal 32 and a twelfth current terminal 82 coupled to the signal input 38. A sixth control terminal 83 is coupled to the acceleration input 46. A lead source-to-drain resistor $R_{SD0}$ is coupled between the eleventh current terminal 80 and the twelfth current terminal 82. The lead source-to-resistor $R_{DS0}$ is shunted when the fourth FET $F_{RSD0}$ is on. An anticipated control signal determines the on/off state of the fourth FET $F_{RSD0}$.

In the exemplary embodiment of FIG. 14, the RF switch 30 also has a common gate resistor $R_{GCM1}$ and a delay resistor $R_{DLY1}$ coupled in series between a gate control terminal 84 for receiving the gate signal and the signal input 42 of the first stage of the stages 36. The common gate resistor $R_{GCM1}$ can have as large or larger resistance value as the gate resistors $R_{G\#}$. Therefore, it is advantageous with regard to switching speed to shunt the common gate resistor $R_{GCM1}$ during a turn-on transition of the RF switch 30.

A fifth FET $F_{RGCM1}$ is included in the RF switch 30 to shunt the common gate resistor $R_{GCM1}$. The fifth FET $F_{RGCM1}$ has a seventh control terminal 86 for controlling the on/off state of the fifth FET $F_{RGCM1}$, a thirteenth current terminal 88 coupled to one end 90 of the common gate resistor $R_{GCM1}$ and a fourteenth current terminal 92 that is in turn communicatively coupled to the control input 42. The common gate resistor $R_{GCM1}$ is shunted when the fifth FET $F_{RGCM1}$ is in an on state. In the exemplary embodiment, the seventh control terminal 86 is coupled to the acceleration input 46 through a lead acceleration resistor $R_{ACC0}$.

In general, parasitic capacitances for the lead RF switching device F0 and the RF switching devices F# are in a picofarad range, whereas parasitic capacitances for the first FET $F_{RG\#}$, the second FET $F_{RSD\#}$, the third FET $F_{GCD\#}$, the fourth FET $F_{RSD0}$, and the fifth FET $F_{RGCM1}$ are in a femtofarad range. This relatively large parasitic capacitance range difference results from the first FET $F_{RG\#}$, the second FET $F_{RSD\#}$, the third FET $F_{GCD\#}$, the fourth FET $F_{RSD0}$, and the fifth FET $F_{RGCM1}$ being an order of magnitude smaller in size than the lead RF switching device F0 and the RF switching devices F#. Therefore, responses to the anticipated control signal for the first FET $F_{RG\#}$, the second FET $F_{RSD\#}$, the third FET $F_{GCD\#}$, the fourth FET fourth FET $F_{RSD0}$, and the fifth FET $F_{RGCM1}$ can be an order of magnitude faster than responses to the gate signal for the lead RF switching device F0 and the RF switching devices F#.

In this regard, a resistance value of the delay resistor $R_{DLY}$ can be selected to provide a time constant that causes the anticipated control signal to arrive at the acceleration input 46 before the gate signal arrives at the control input 42 of the first stage. The time constant is the resistance value times a total parasitic gate capacitance of the RF switch 30. In an exemplary embodiment, the resistance value of the delay resistor is selected to ensure that the anticipated control signal arrives at the acceleration input 46 at least 400 nanoseconds before the gate signal arrives at the control input 42 of the first stage of the stages 36.

The RF switch 30 further includes an anticipated control signal generator 94 having a gate control input 96 for receiving a gate signal that controls the on/off state of the RF switching devices F#. The gate control input 96 is coupled to the gate control terminal 84. The anticipated control signal generator 94 also has an anticipated control signal output 98 coupled to the acceleration input 46 through the lead acceleration resistor $R_{ACC0}$. The anticipated control signal generator 94 is configured to generate an anticipated control signal from the gate signal and output the anticipated control signal to the acceleration input 46 before the gate signal arrives at the control input 42 of the first stage of the stages 36.

Figure 15:
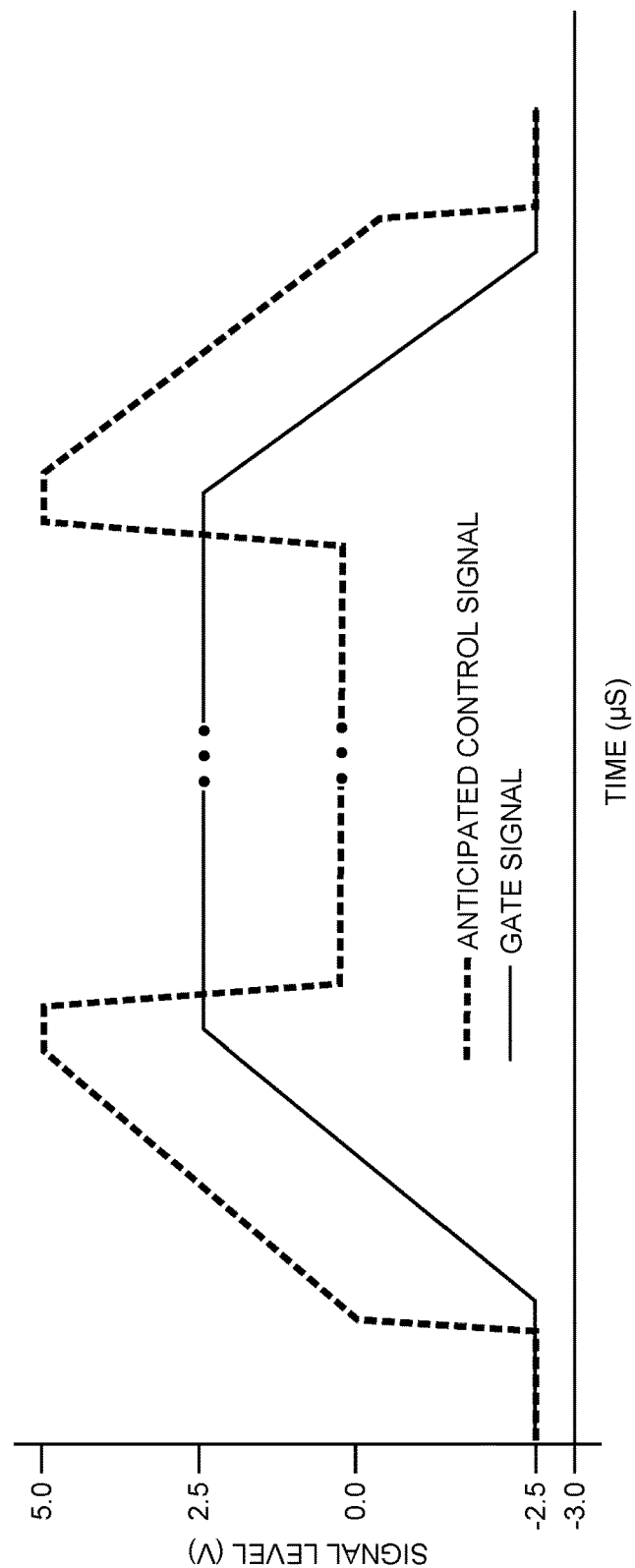
FIG. 15 is a graph of an exemplary gate signal and an exemplary anticipated control signal.

FIG. 15 is a graph depicted an exemplary anticipated control signal generated by the anticipated control signal generator 94 of FIG. 14. In this exemplary embodiment, the anticipated control signal generator 94 is further configured to ramp a voltage level of the anticipated control signal from an off voltage common to the first FET $F_{RG\#}$, the second FET $F_{RSD\#}$, the third FET $F_{GCD\#}$, the fourth FET $F_{RSD0}$, and the fifth FET $F_{RGCM1}$ to a ground voltage at a first slope and from the ground voltage through an on voltage to a peak on voltage common to the first FET $F_{RG\#}$, the second FET $F_{RSD\#}$, the third FET $F_{GCD\#}$, the fourth FET fourth FET $F_{RSD0}$, and the fifth FET $F_{RGCM1}$ at a second slope that is less than the first slope in response to a turn-on transition of a gate signal. A parasitic gate capacitance of the first FET $F_{RG\#}$ is charged during the ramping of the anticipated control signal. An exemplary off voltage is −2.5 V. An exemplary on voltage is +2.5 V, and an exemplary peak on voltage is +5.0 V. The peak on voltage causes the first FET $F_{RG\#}$, the second FET $F_{RSD\#}$, the third FET $F_{GCD\#}$, the fourth FET fourth FET $F_{RSD0}$, and the fifth FET $F_{RGCM1}$ to turn on hard and present an on resistance that is relatively lower than an on resistance of the turn-on voltage. However, it is not recommended that the peak on voltage be maintained for a time longer than necessary to complete a switching transition of the RF switch 30 from fully off to fully on because damage may occur over longer time periods.

In this regard, the anticipated control signal generator 94 is further configured to lower the anticipated control signal from the peak on voltage to the ground voltage at a third slope having a magnitude greater than the second slope once the gate signal has turned on the RF switching device 30. However, during a time period between just after the turn-on transition and a turn-off transition, the gate of the first FET $F_{RG\#}$ is left floating and the charged gate maintains the on-state of the first FET $F_{RG\#}$. As such, the gate resistor $R_{G\#}$ remains shunted as long as the established charge remains on the gate of the first FET $F_{RG\#}$.

Also in this embodiment, the anticipated control signal generator 94 is yet further configured to ramp the anticipated control signal from the ground voltage through the on voltage to the peak on voltage at a fourth slope greater than the second slope in response to a turn-off transition of the gate signal. In the exemplary embodiment, the peak on voltage is maintained for a predetermined time that is just long enough to drain the accumulated charge from the gate capacitance of the first FET $F_{RG\#}$. This results in removing the floating state of the gate of the first FET $F_{RG\#}$.

Further still, the anticipated control signal generator 94 is further configured to ramp the anticipated control signal from the peak on voltage through the on voltage to the ground voltage once the turn-on transition of the gate signal is complete. The anticipated control signal generator 94 is yet further configured to ramp the anticipated control signal from ground voltage to off voltage once the gate signal has turned off the RF switch 30.

Figure 16:
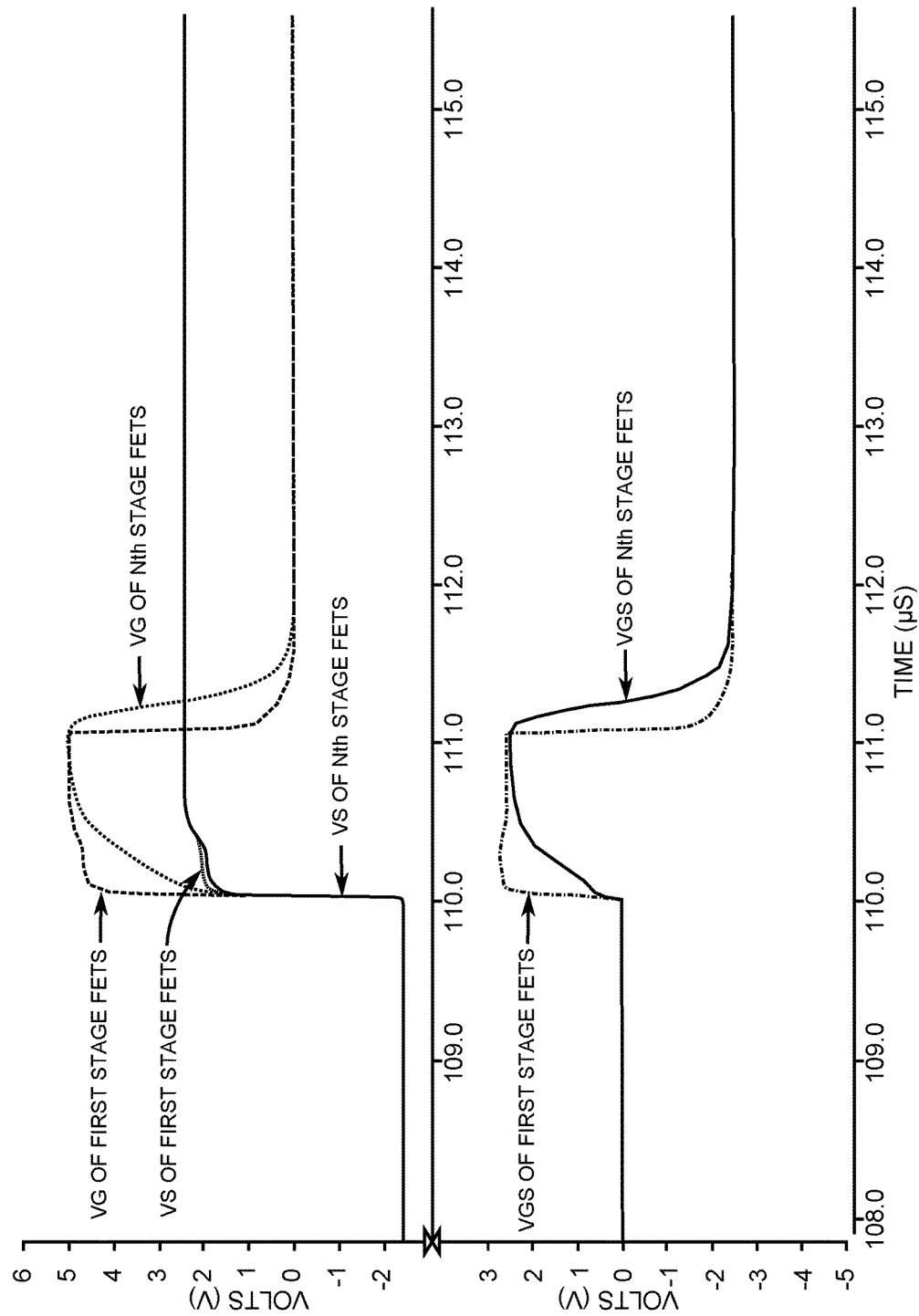
FIG. 16 is a graph of simulated drive voltages associated with the RF switch of FIG. 14 during turn-on of the RF switch.
Figure 17:
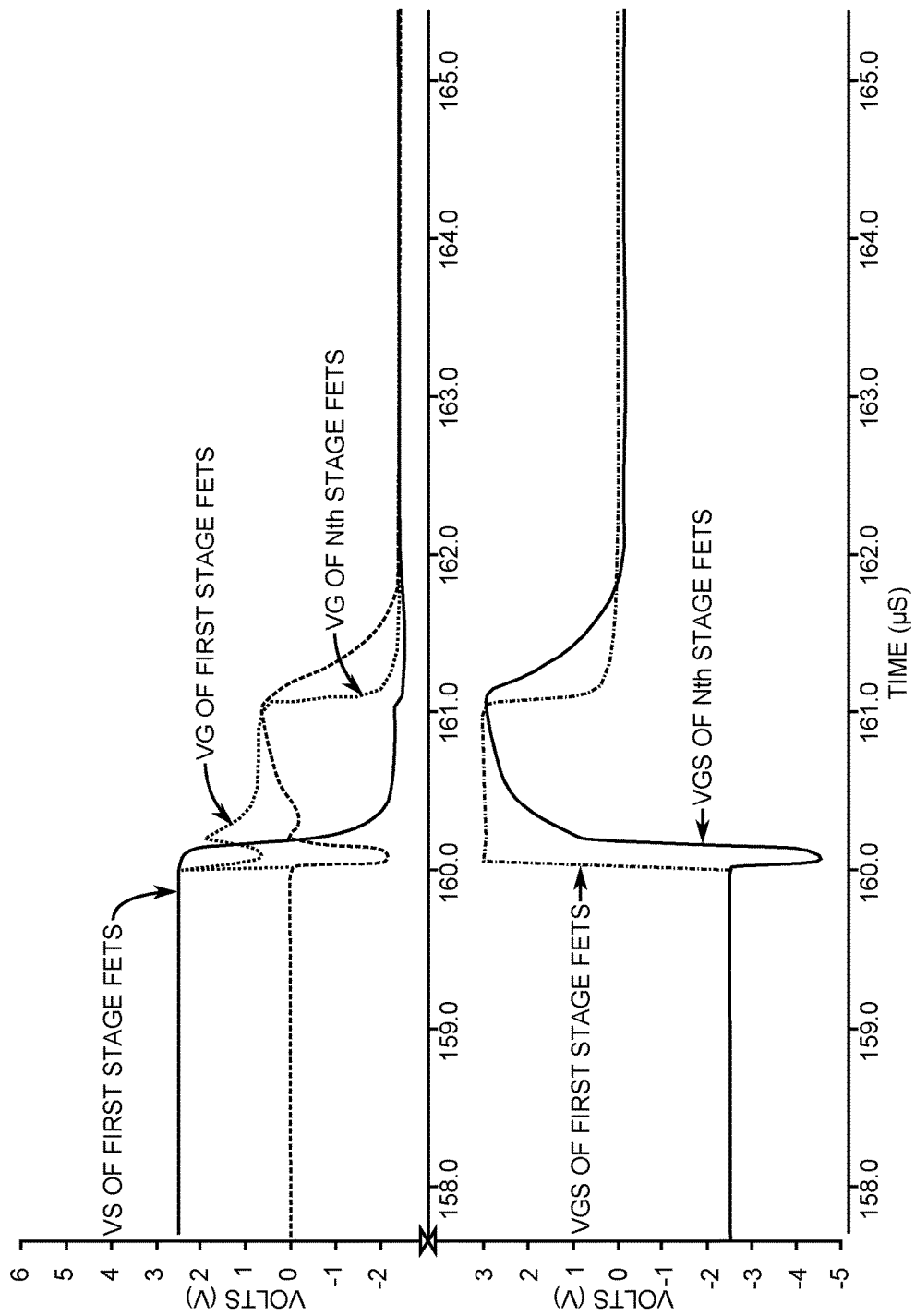
FIG. 17 is a graph of simulated turn-off drive voltages associated with the RF switch of FIG. 14.
Figure 18:
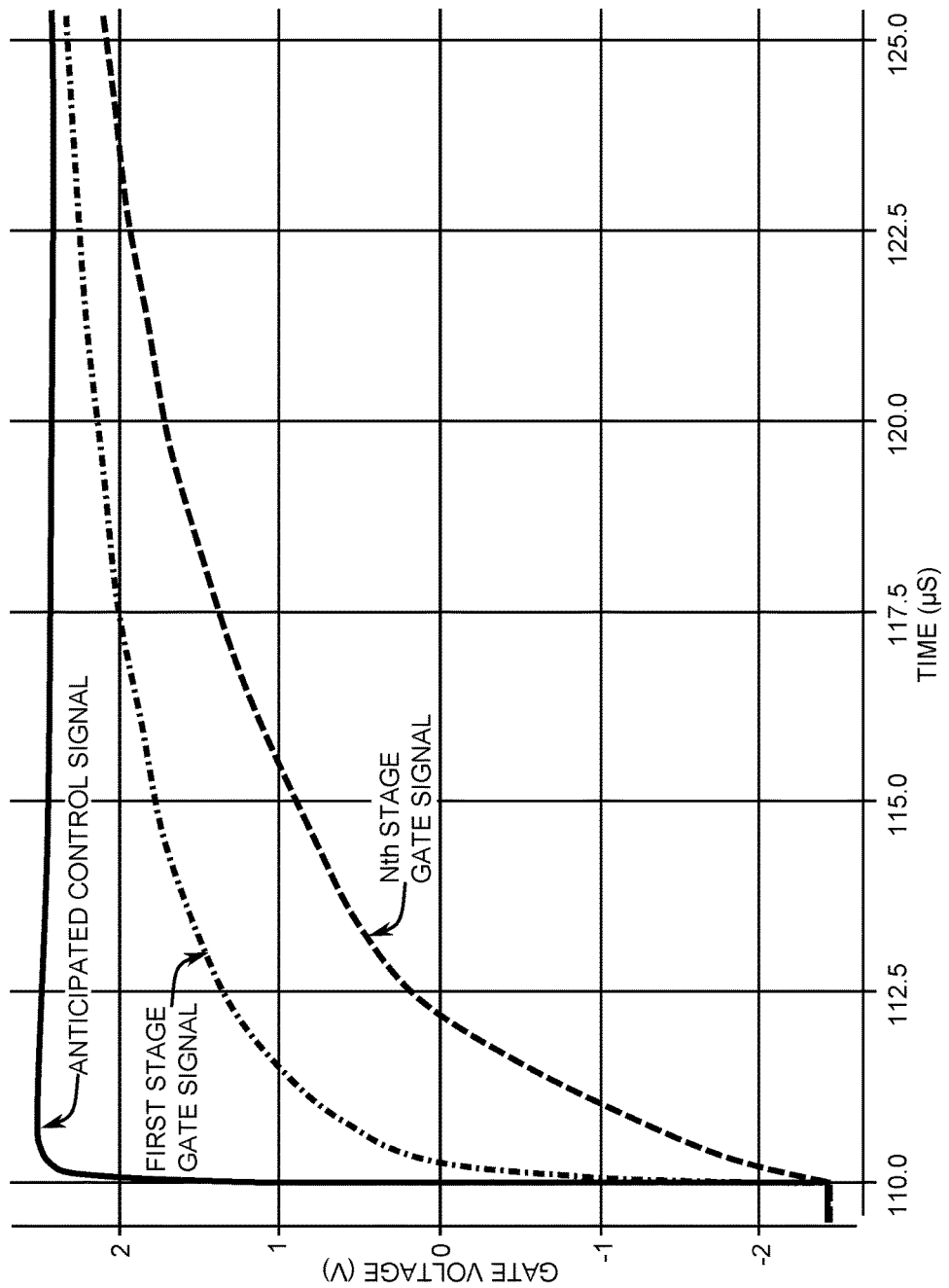
FIG. 18 is a graph providing a comparison of the responsiveness of the gate signal voltages for the first and last stages of the RF switch in further comparison to the anticipated control signal.
Figure 19:
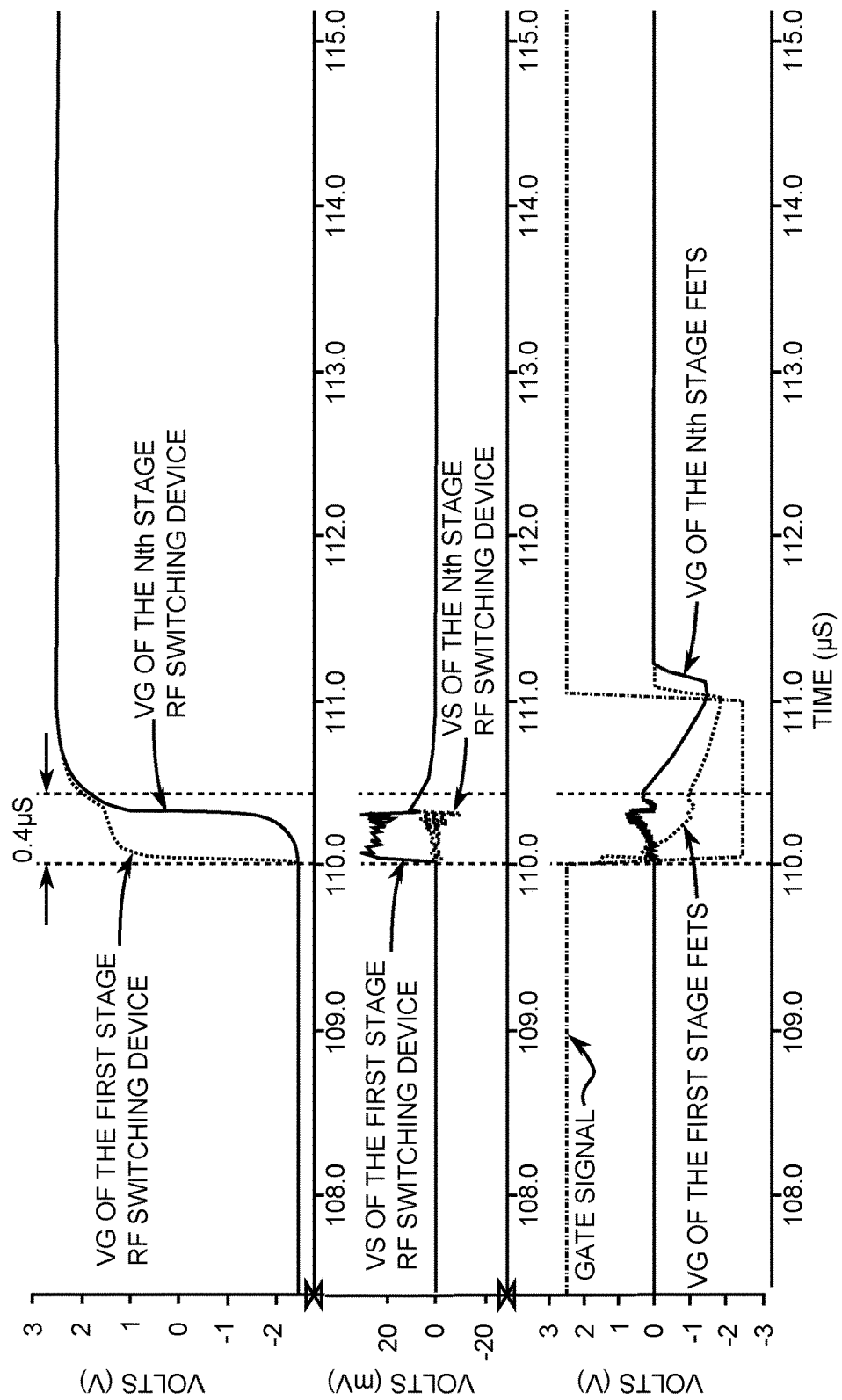
FIG. 19 is a graph depicting voltages associated with turning on the RF switch.
Figure 20:
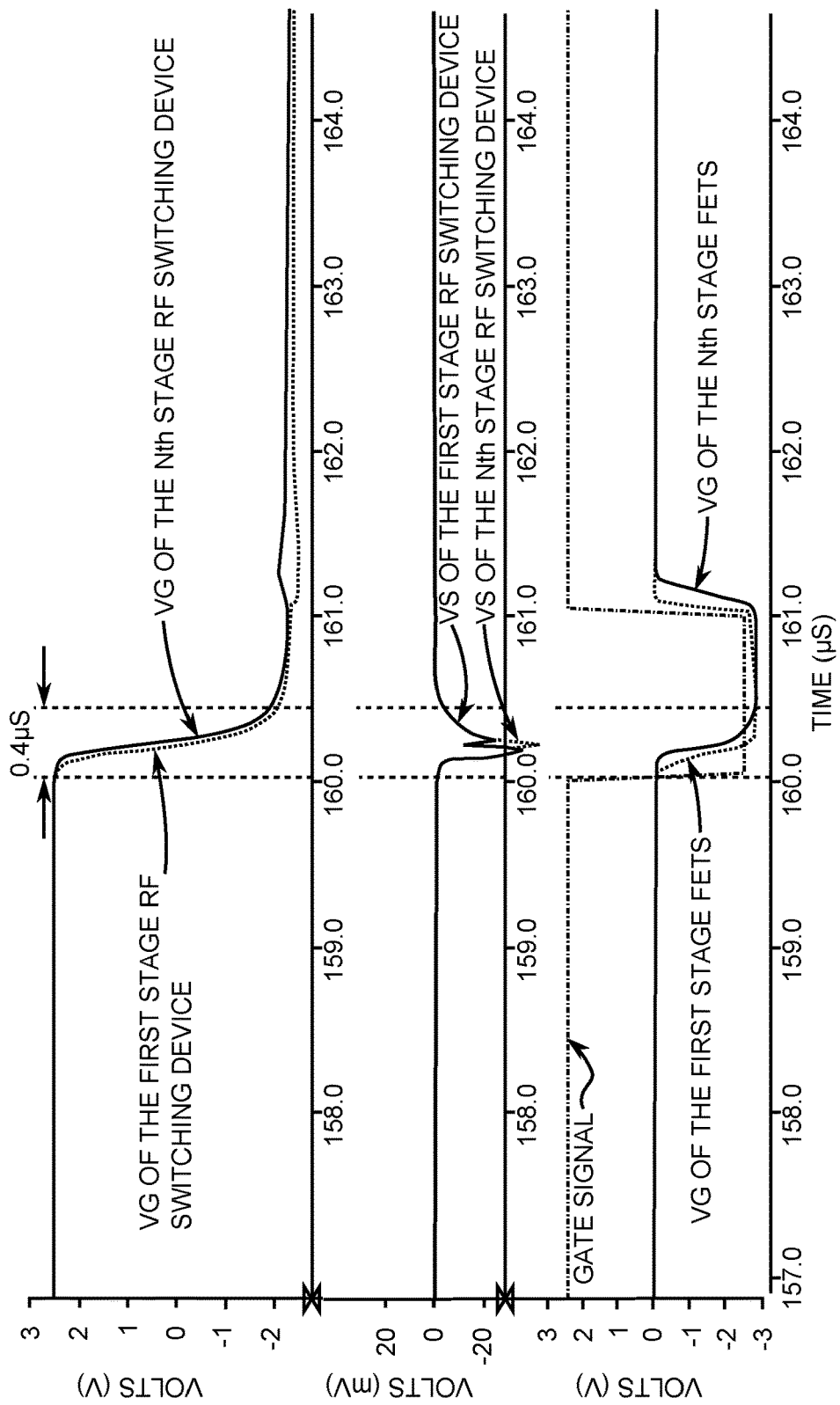
FIG. 20 is a graph depicting voltages associated with turning off the RF switch.

FIG. 15 is a graph of an exemplary gate signal and an exemplary anticipated control signal. FIG. 16 is a graph of simulated drive voltages associated with the RF switch 30 of FIG. 14 during turn-on of the RF switch 30. FIG. 17 is a graph of simulated turn off drive voltages associated with the RF switch 30 of FIG. 14. FIG. 18 is a graph providing a comparison of the responsiveness of the gate signal voltages for the first and last stages of the RF switch 30 in further comparison to the anticipated control signal. FIG. 19 is a graph depicting voltages associated with turning on the RF switch 30. FIG. 20 is a graph depicting voltages associated with turning off the RF switch 30.

Figure 21:
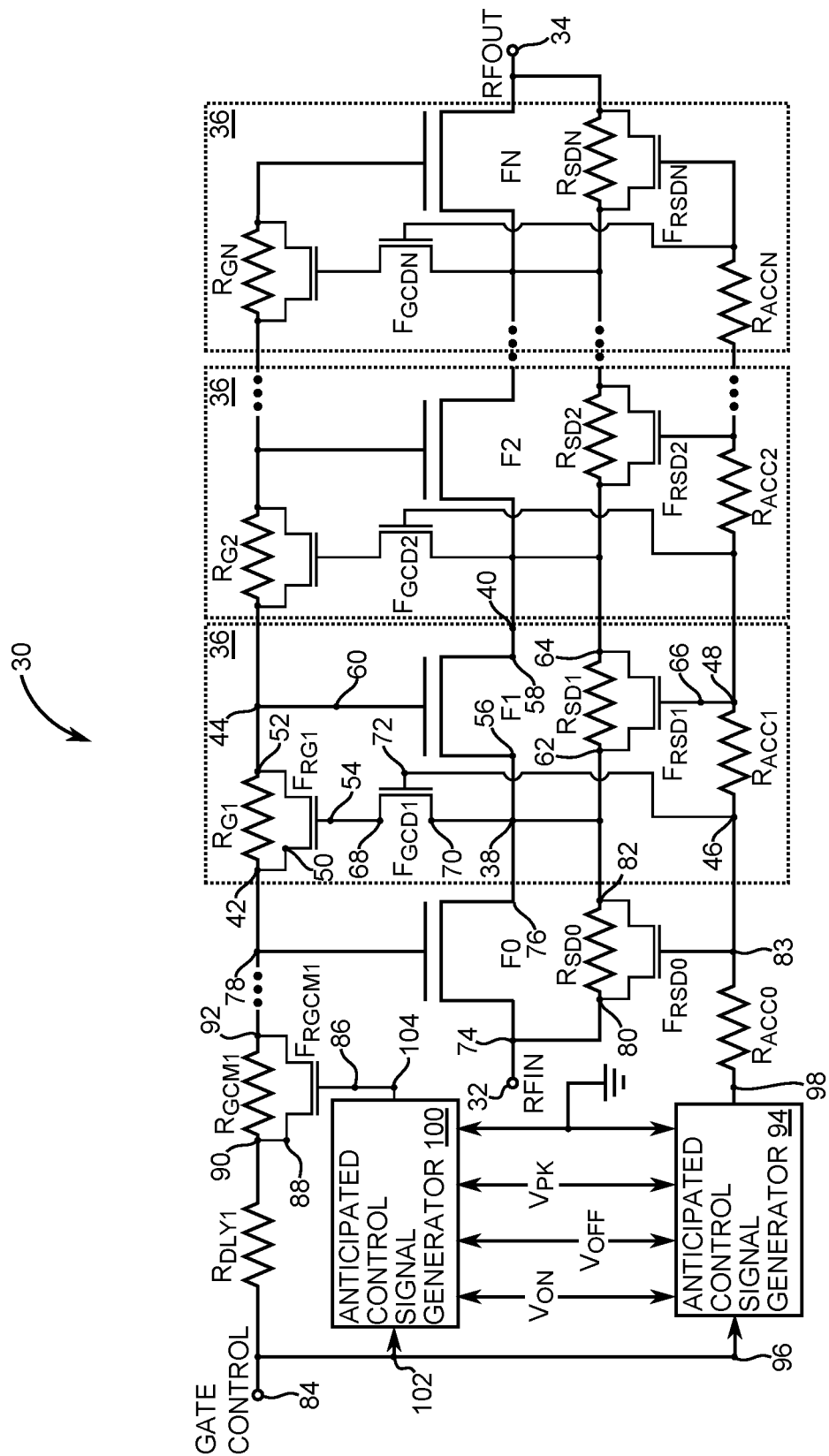
FIG. 21 is a schematic of another embodiment of the RF switch that includes a second anticipated control signal generator.
Figure 22:
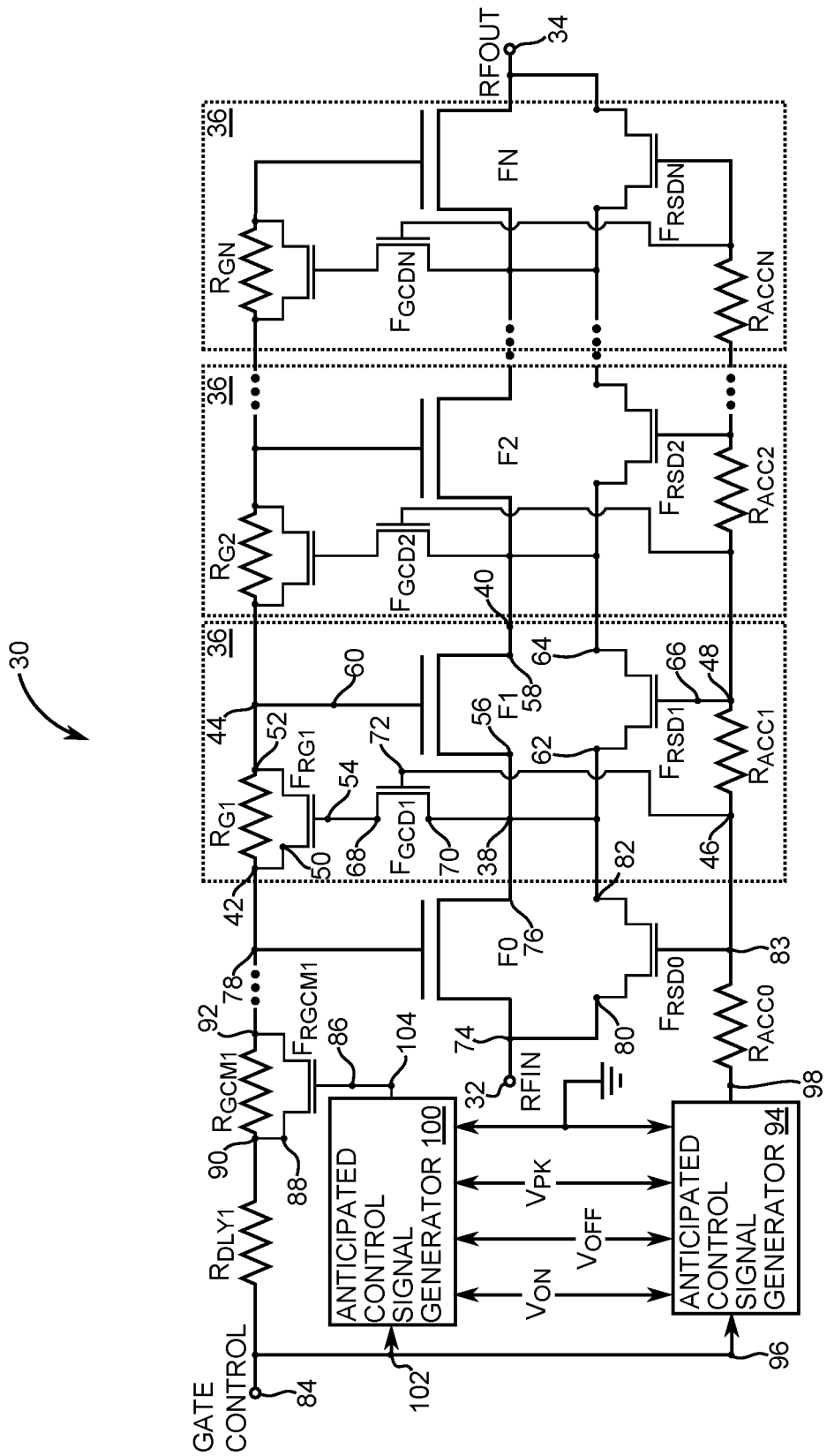
FIG. 22 depicts an embodiment that is almost identical to the embodiment of FIG. 21, an exception being that there are no drain-to-source resistors.

FIG. 21 is a schematic of another embodiment of the RF switch 30. In this embodiment, a second anticipated control signal generator 100 is included to provide an additional degree of freedom by separating the control of the fifth FET $F_{RGCM1}$ from the control of the remainder of the RF switch 30. The second anticipated control signal generator 100 has a second gate control input 102 for receiving the gate signal that controls the on/off state of the RF switching devices F#. The second gate control input 102 is coupled to the gate control terminal 84. The second anticipated control signal generator 100 also has an anticipated control signal output 104 coupled to the seventh control terminal 86. The second anticipated control signal generator 100 is configured to generate a second anticipated control signal from the gate signal and output the second anticipated control signal to the seventh control terminal 86 before the gate signal arrives at the control input 42 of the first stage of the stages 36. Moreover, in one embodiment, the second anticipated control signal generator 100 is configured to generate an anticipated control signal similar to the one depicted in FIG. 15. However, in other embodiments, the second anticipated control signal generator 100 is configured to generate an anticipated control signal that has different voltage ramp slopes in comparison to the voltage ramp slopes depicted in FIG. 15. FIG. 22 depicts an embodiment that is almost identical to the embodiment of FIG. 21, an exception being that there are no drain-to-source resistors.

Those skilled in the art will recognize improvements and modifications to the present disclosure. All such improvements and modifications are considered within the scope of the concepts disclosed herein.

What is claimed is:

1. A radio frequency (RF) switch comprising:
two or more stages coupled in series between an RF input terminal and an RF output terminal, each stage comprising:
a gate resistor coupled between a control input and a control output;
a first field-effect transistor (FET) having a first current terminal coupled to the control input and a second current terminal coupled to the control output to shunt the gate resistor when the first FET is on, and a first control terminal for controlling an on/off state of the first FET;
an RF switching device having a third current terminal coupled to a signal input, a fourth current terminal coupled to a signal output to pass an RF signal between the signal input and the signal output when the RF switching device is on, and a second control terminal coupled to the control output for controlling an on/off state of the RF switching device, wherein the signal input of a first stage of the two or more stages is communicatively coupled to the RF input terminal, and the signal output of a last stage of the two or more stages is coupled to the RF output terminal and the signal output of a proceeding stage of the two or more stages is coupled to the signal input of a following stage of the two or more stages;
a second FET having a fifth current terminal coupled to the signal input and a sixth current terminal coupled the signal output to shunt the RF switching device when the second FET is on, and a third control terminal coupled to an acceleration output for controlling an on/off state of the second FET; and
a third FET having a seventh current terminal coupled to the first control terminal of the first FET, an eighth current terminal coupled to the signal input for controlling charge on a gate of the first FET, and a fourth control terminal coupled to an acceleration input for controlling an on/off state of the third FET.

2. The RF switch of claim 1 further comprising an anticipated control signal generator having a gate control input for receiving a gate signal that controls the on/off state of the RF switching device, and an anticipated control signal output coupled to the acceleration input, wherein the anticipated control signal generator is configured to generate an anticipated control signal from the gate signal and output the anticipated control signal to the acceleration input before the gate signal arrives at the control input of the two or more stages.

3. The RF switch of claim 2 wherein the anticipated control signal generator is further configured to ramp a voltage level of the anticipated control signal from an off voltage of the first FET, the second FET, and the third FET to a ground voltage at a first slope and from the ground voltage through an on voltage to a peak on voltage of the first FET, the second FET, and the third FET at a second slope that is less than the first slope in response to a turn-on transition of the gate signal.

4. The RF switch of claim 3 wherein the anticipated control signal generator is further configured to lower the anticipated control signal from the peak on voltage to the ground voltage at a third slope having a magnitude greater than the second slope once the gate signal has turned on the RF switching device.

5. The RF switch of claim 4 wherein the anticipated control signal generator is further configured to ramp the anticipated control signal from the ground voltage through the on voltage to the peak on voltage at a fourth slope greater than the second slope in response to a turn-off transition of the gate signal.

6. The RF switch of claim 5 wherein the anticipated control signal generator is further configured to maintain the anticipated control signal at the peak on voltage for a predetermined time to drain charge from the gate of the first FET.

7. The RF switch of claim 6 wherein the anticipated control signal generator is further configured to ramp the anticipated control signal from the peak on voltage through the on voltage to the ground voltage once the turn-on transition of the gate signal is complete.

8. The RF switch of claim 7 wherein the anticipated control signal generator is further configured to ramp the anticipated control signal from ground voltage to off voltage once the gate signal has turned off the RF switching device.

9. The RF switch of claim 1 further comprising an acceleration resistor coupled between the acceleration input and the acceleration output.

10. The RF switch of claim 1 further comprising a drain-to-source resistor coupled between the signal input and the signal output.

11. The RF switch of claim 1 wherein the control output of the proceeding stage of the two or more stages is coupled to the control input of the following stage of the two or more stages.

12. The RF switch of claim 1 wherein the acceleration output of the proceeding stage of the two or more stages is coupled to the acceleration input of the following stage of the two or more stages.

13. The RF switch of claim 1 further comprising a lead RF switching device having a ninth current input terminal coupled to the RF input terminal, a tenth current input terminal coupled to the signal input of the first stage, and a fifth control terminal coupled to the control input of the first stage.

14. The RF switch of claim 13 further comprising a fourth FET having an eleventh current terminal coupled to the RF input terminal and a twelfth current terminal coupled to the signal input of the first stage, and a sixth control terminal coupled to the acceleration input of the first stage.

15. The RF switch of claim 2 further comprising a common gate resistor and a delay resistor coupled in series between a gate control terminal for receiving the gate signal and the signal input of the first stage of the two or more stages.

16. The RF switch of claim 15 wherein a resistance value of the delay resistor is selected to provide a time constant that causes the anticipated control signal to arrive at the acceleration input at least 400 ns before the gate signal arrives at the control input of the first stage.

17. The RF switch of claim 15 further comprising a fifth FET having a seventh control terminal for controlling an off/on state of the fifth FET, a thirteenth current terminal coupled to one end of the common gate resistor and a fourteenth current terminal coupled to another end of the common gate resistor such that the common gate resistor is shunted when the fifth FET is in an on state.

18. The RF switch of claim 17 wherein the fifth FET having the seventh control terminal is coupled to the anticipated control signal output of the anticipated control signal generator.

19. The RF switch of claim 17 further including a second anticipated control signal generator having a second gate control input for receiving the gate signal that controls the on/off state of the RF switching device, and a second anticipated control signal output coupled to the seventh control terminal, wherein the second anticipated control signal generator is configured to generate a second anticipated control signal from the gate signal and output the second anticipated control signal to the seventh control terminal before the gate signal arrives at the control input of the two or more stages.

20. A radio frequency (RF) switch comprising:
a gate resistor coupled to a control input;
a first field-effect transistor (FET) coupled across the gate resistor to shunt the gate resistor when the first FET is on, the first FET including a first control terminal;
an RF switching device having a control terminal coupled to the gate resistor and configured to pass an RF signal between a signal input and a signal output when the RF switching device is on;
a second FET having a second control terminal coupled to an acceleration output and coupled across the RF switching device to shunt the RF switching device when the second FET is on;
a third FET coupled between the first control terminal and the signal input for controlling charge on a gate of the first FET, wherein a third control terminal of the third FET is coupled to an acceleration input for controlling an on/off state of the third FET; and
an anticipated control signal generator having a gate control input for receiving a gate signal that controls the on/off state of the RF switching device, and an anticipated control signal output coupled to the acceleration input, wherein the anticipated control signal generator is configured to generate an anticipated control signal from the gate signal and output the anticipated control signal to the acceleration input before the gate signal arrives at the control input.

* * * * *